(12) United States Patent
Salem

(10) Patent No.: US 11,412,645 B2
(45) Date of Patent: Aug. 9, 2022

(54) EMF SHIELDING MATERIAL FOR AN ELECTRONIC DEVICE

(71) Applicant: Switch Project, LLC, Woodland Hills, CA (US)

(72) Inventor: Ben Salem, Woodland Hills, CA (US)

(73) Assignee: Switch Project, LLC, Woodland Hills, CA (US)

( * ) Notice: Subject to any disclaimer, the term of this patent is extended or adjusted under 35 U.S.C. 154(b) by 0 days.

(21) Appl. No.: 17/009,570

(22) Filed: Sep. 1, 2020

(65) Prior Publication Data

US 2020/0396873 A1  Dec. 17, 2020

Related U.S. Application Data

(63) Continuation-in-part of application No. 16/823,696, filed on Mar. 19, 2020, which is a continuation-in-part of application No. 16/741,550, filed on Jan. 13, 2020.

(60) Provisional application No. 62/792,280, filed on Jan. 14, 2019, provisional application No. 62/885,737, filed on Aug. 12, 2019.

(51) Int. Cl.
  *G06F 1/16* (2006.01)
  *H05K 9/00* (2006.01)

(52) U.S. Cl.
  CPC .......... *H05K 9/0081* (2013.01); *G06F 1/163* (2013.01); *G06F 1/1656* (2013.01)

(58) Field of Classification Search
  CPC .... H05K 9/0081; H05K 9/0088; G06F 1/163; G06F 1/1656; G06F 1/1607; G06F 1/1632; G06F 1/1635; G06F 1/1698; G06F 3/0362; G06F 3/0482; G06F 3/04847; H04R 1/1016; H04R 1/1058; H04R 1/1066; H04R 2201/103; H04R 2225/49; H04R 2420/07; G04G 17/02; G04G 21/00
  USPC ........................................... 361/679.03
  See application file for complete search history.

(56) References Cited

U.S. PATENT DOCUMENTS

| 5,335,366 A * | 8/1994 | Daniels ............... H04B 1/3838 343/702 |
| 6,356,773 B1 * | 3/2002 | Rinot ..................... H01Q 1/526 455/562.1 |
| 10,374,816 B1 | 8/2019 | Leblang |
| 10,750,268 B2 * | 8/2020 | Dang ................... H04R 1/1025 |
| 2002/0097188 A1 | 7/2002 | Coloney |

(Continued)

OTHER PUBLICATIONS

The International Search Report with Written Opinion dated Apr. 24, 2020, for PCT Application No. PCT/US2020/013381.

*Primary Examiner* — Naomi J Small
(74) *Attorney, Agent, or Firm* — CP Law Group PC; Cy Bates

(57) ABSTRACT

An electromagnetic magnetic shielding material is used deflect electronic and electromagnetic radiation away from an electronic device. In this manner, the electromagnetic shielding material deflects the electronic and electromagnetic radiation from a user of the device to protect the user from any electronic and electromagnetic radiation produced by the electronic device. Additionally, because the electronic and electromagnetic radiation is deflected away from the user, rather than absorbed, a user is able to safely use the electronic device with less or no exposure to electronic and electromagnetic radiation.

17 Claims, 30 Drawing Sheets

(56) References Cited

U.S. PATENT DOCUMENTS

| | | | |
|---|---|---|---|
| 2002/0148625 A1* | 10/2002 | Darling | H01Q 1/245 |
| | | | 174/363 |
| 2009/0088876 A1 | 4/2009 | Conley et al. | |
| 2009/0121931 A1 | 5/2009 | Katz | |
| 2010/0073870 A1* | 3/2010 | Diez Munoz | H05K 9/0084 |
| | | | 361/679.55 |
| 2010/0097228 A1* | 4/2010 | Schultz | G08B 17/12 |
| | | | 340/600 |
| 2013/0331058 A1 | 12/2013 | Harvey | |
| 2014/0009435 A1* | 1/2014 | Shih | G06F 3/046 |
| | | | 345/174 |
| 2015/0107022 A1 | 4/2015 | Al Yazdi | |
| 2015/0221244 A1 | 8/2015 | Miller | |
| 2015/0380847 A1 | 12/2015 | Sun et al. | |
| 2015/0382096 A1 | 12/2015 | Lamar | |
| 2016/0091922 A1* | 3/2016 | Nazzaro | G04C 10/00 |
| | | | 307/104 |
| 2016/0164973 A1 | 6/2016 | Kapoor | |
| 2016/0253050 A1 | 9/2016 | Mishra et al. | |
| 2016/0274408 A1* | 9/2016 | Bushnell | H05K 9/0071 |
| 2017/0164670 A1 | 6/2017 | Hale | |
| 2017/0278585 A1* | 9/2017 | Almer | B32B 5/08 |
| 2017/0290207 A1* | 10/2017 | Smith | H05K 1/18 |
| 2017/0359644 A1* | 12/2017 | Cramer | H04R 1/1008 |
| 2018/0343024 A1 | 11/2018 | Sahebjavaher et al. | |
| 2018/0368365 A1 | 12/2018 | Van Curen et al. | |
| 2018/0376235 A1* | 12/2018 | Leabman | H02J 50/15 |
| 2019/0327778 A1* | 10/2019 | Morris | H04W 88/04 |
| 2019/0348751 A1* | 11/2019 | Finegold | H01Q 1/002 |
| 2019/0363565 A1* | 11/2019 | Graham | H01F 27/363 |

* cited by examiner

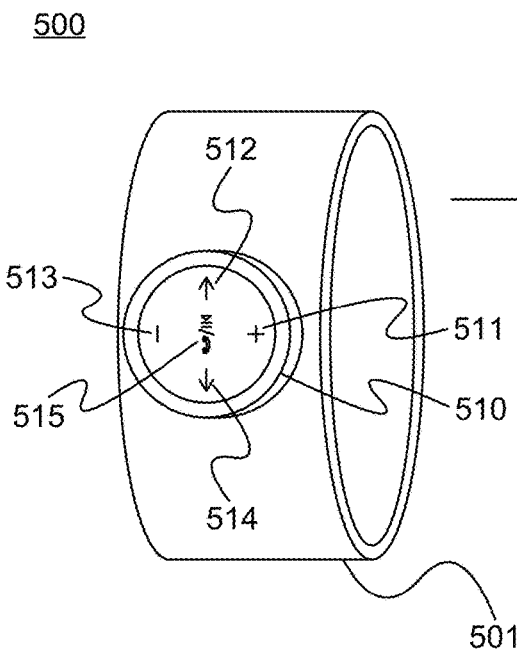
Fig. 5A
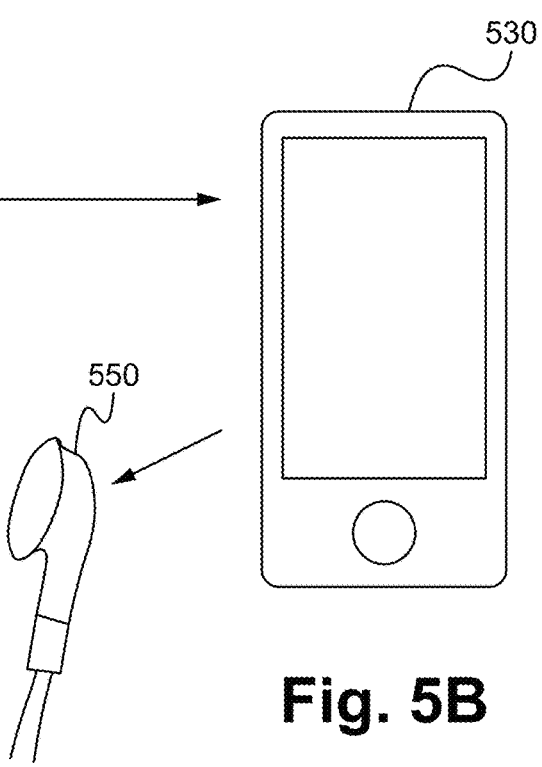
Fig. 5B
Fig. 5C
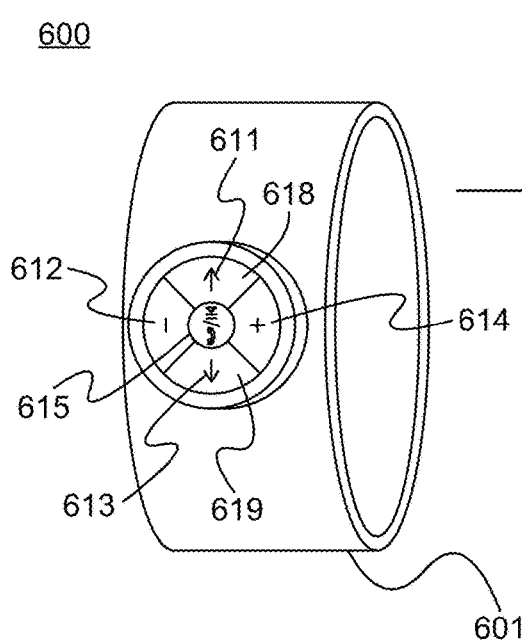
Fig. 6A
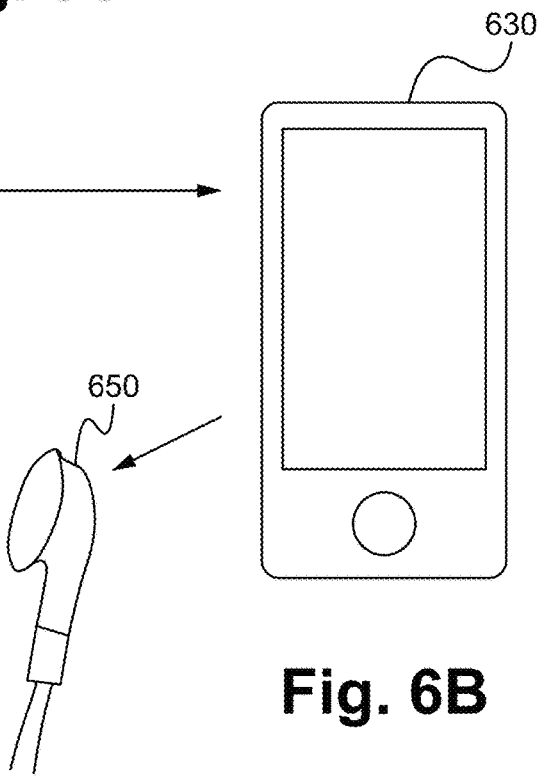
Fig. 6B
Fig. 6C

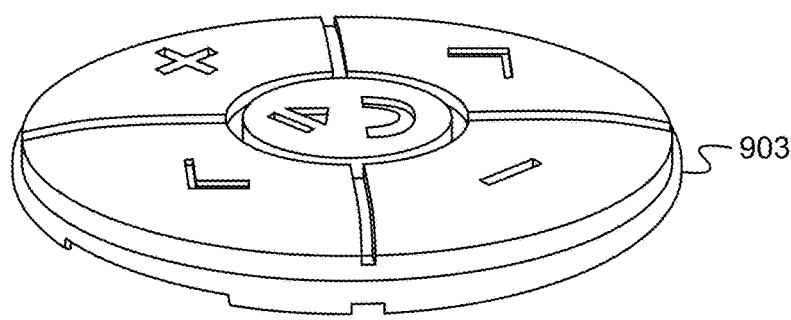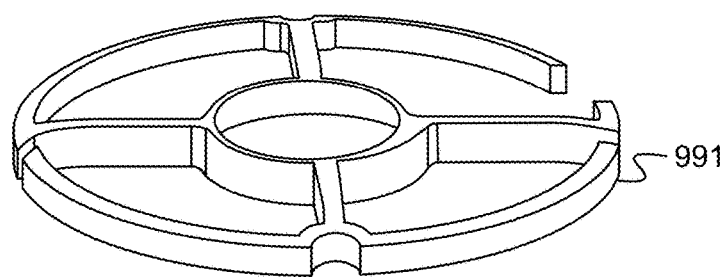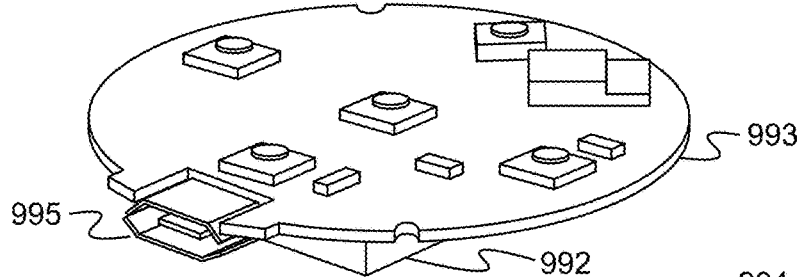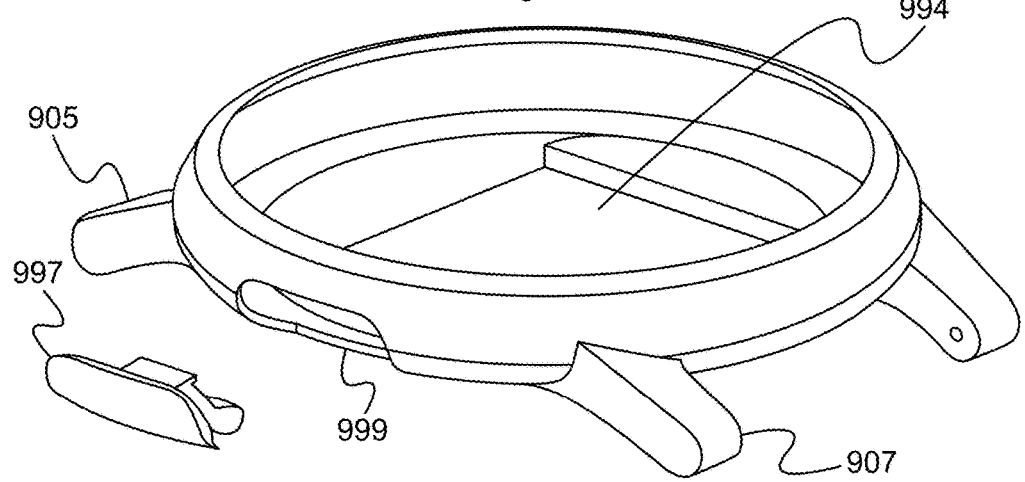
Fig. 9

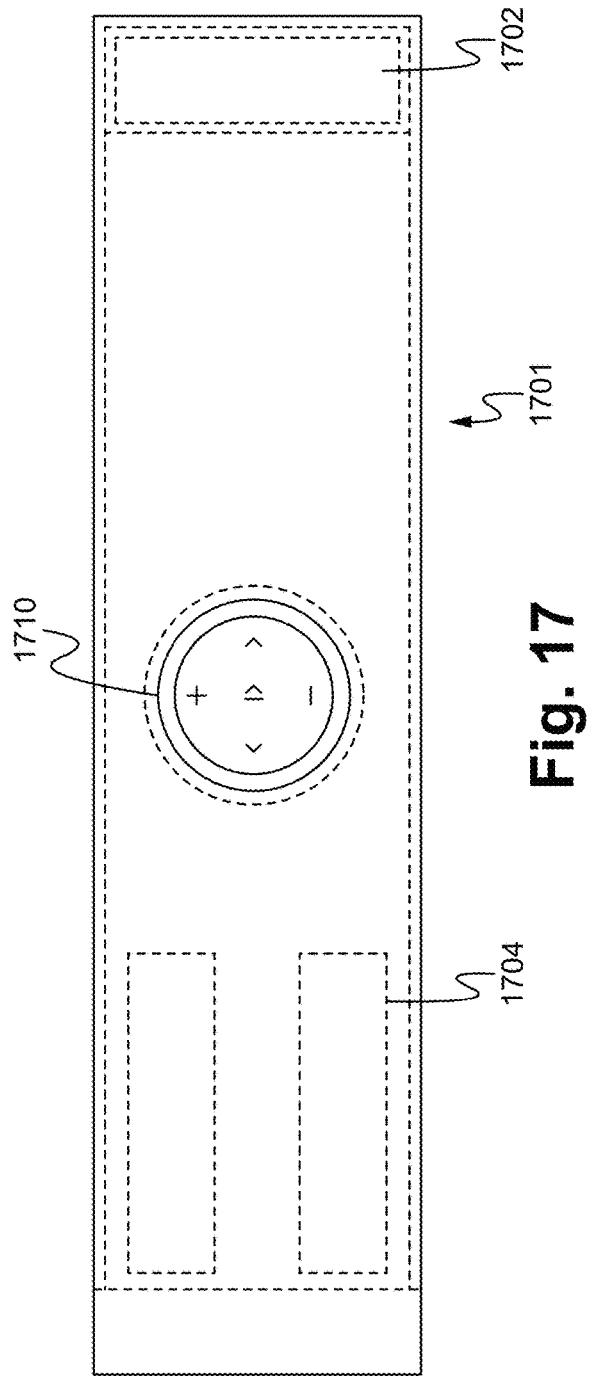
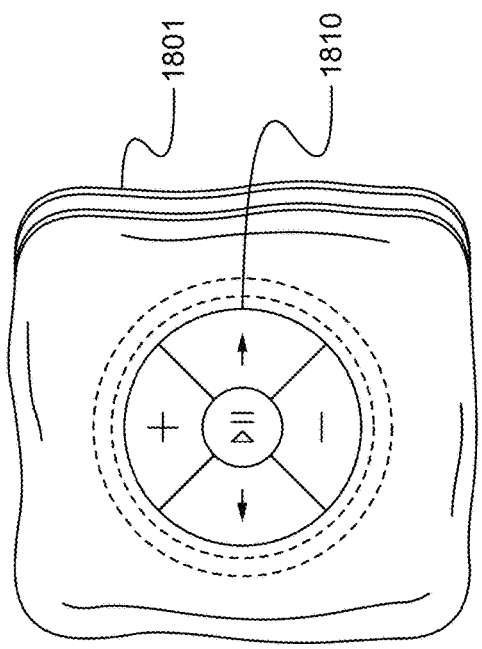
Fig. 17
Fig. 18

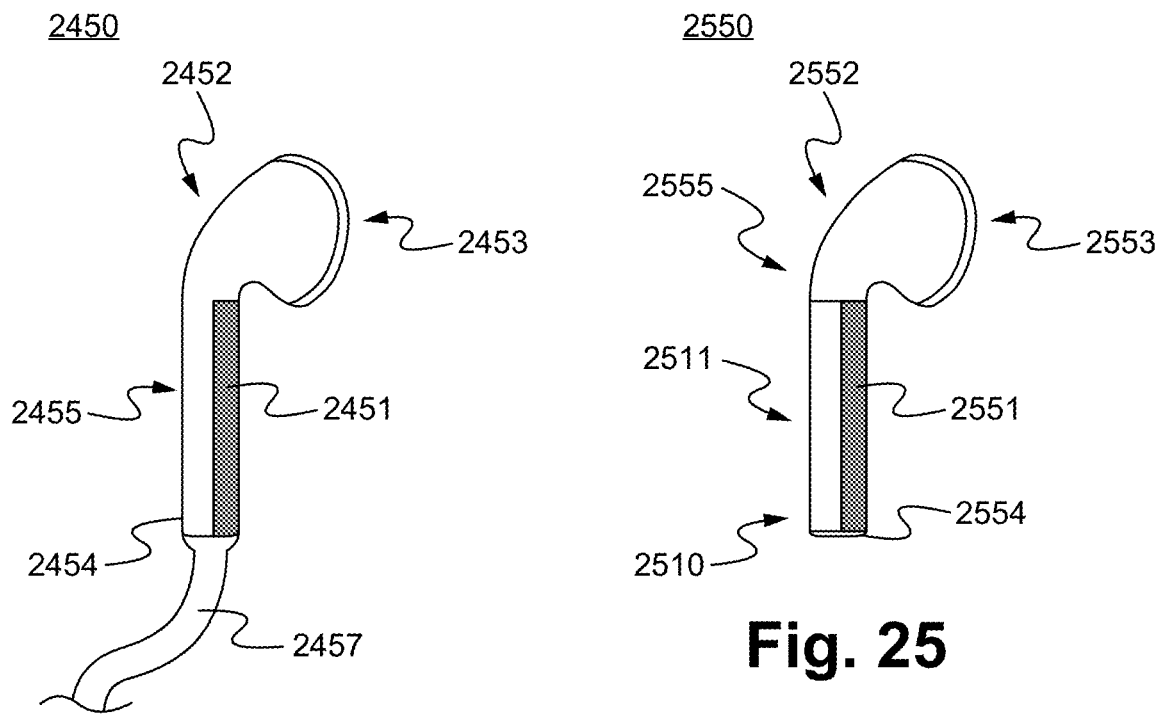
Fig. 24
Fig. 25
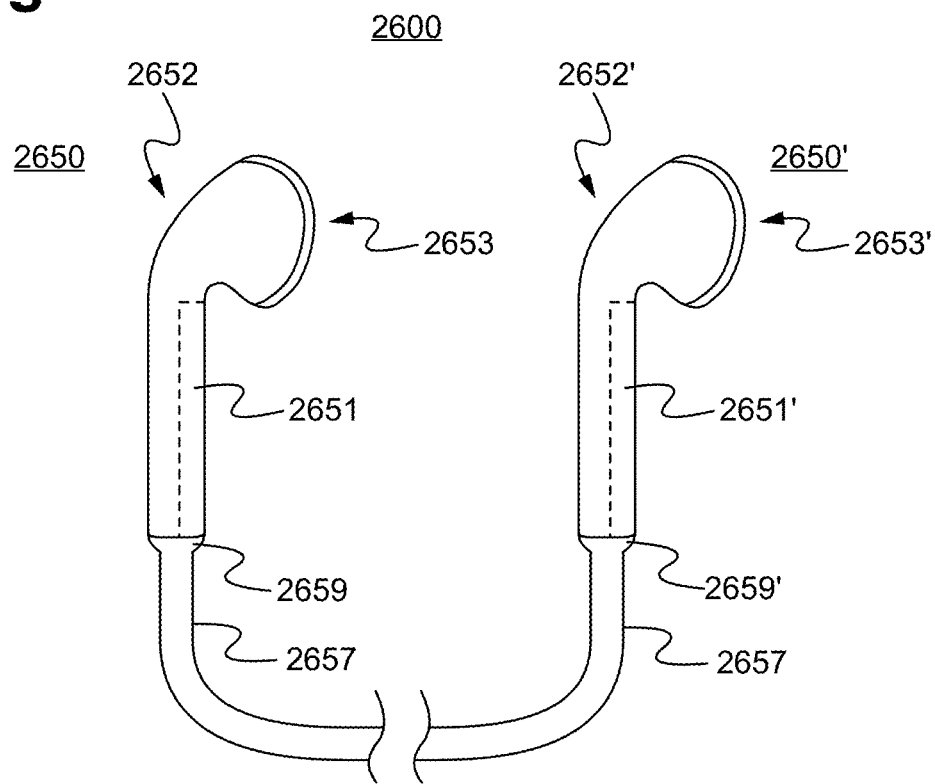
Fig. 26

EMF SHIELDING MATERIAL FOR AN ELECTRONIC DEVICE

RELATED APPLICATIONS

This Patent Application is a continuation-in-part patent application of co-pending U.S. patent application Ser. No. 16/823,696, filed Mar. 19, 2020, and entitled "HEADPHONES WITH EMF SHIELDING MATERIAL," which is a continuation-in-part patent application of co-pending U.S. patent application Ser. No. 16/741,550, filed Jan. 13, 2020, and entitled "WRISTBAND CONTROLLER," which claims priority under 35 U.S.C. 119(e) of the U.S. provisional patent applications, Application No. 62/792,280, filed on Jan. 14, 2019, and entitled "WRISTBAND CONTROLLER," and Application No. 62/885,737, filed on Aug. 12, 2019, and entitled "WRISTBAND CONTROLLER," which are all hereby incorporated by reference in their entirety.

FIELD OF THE INVENTION

The present invention is generally directed to electronic devices. More specifically, the present invention is directed to electromagnetic shielding material and electronic devices comprising an electromagnetic shielding material.

BACKGROUND OF THE INVENTION

Electric and magnetic fields (EMF) comprise invisible radiation associated with the use of common consumer electronics such as microwave ovens, computers, and cell phones. EMF radiation may also be naturally present in the form of ultraviolet radiation, x-rays and gamma rays. Prolonged exposure to EMF radiation may create health problems.

SUMMARY OF THE INVENTION

An electromagnetic magnetic shielding material is used deflect electronic and electromagnetic radiation away from an electronic device. In this manner, the electromagnetic shielding material deflects the electronic and electromagnetic radiation from a user of the device to protect the user from any electronic and electromagnetic radiation produced by the electronic device. Additionally, because the electronic and electromagnetic radiation is deflected away from the user, rather than absorbed, a user is able to safely use the electronic device with less or no exposure to electronic and electromagnetic radiation.

In a first aspect, an electromagnetic shielding device comprises a device body configured for coupling with an object, the device body comprises a first layer, a second layer and a third layer between the first layer and the second layer, wherein the third layer comprises an electromagnetic shielding material, wherein the electromagnetic shielding material is configured to deflect electromagnetic radiation away from the object when the device body is coupled with the object. In some embodiments, the object comprises an object worn by a user. In further embodiments, the object comprises one of a tablet, a smart phone and a computer. In some embodiments, the electromagnetic shielding material is configured to deflect electromagnetic radiation produced by one or more antennas of the of the object. In some embodiments, the device body comprises an adhesive backing material for coupling with the object. In further embodiments, the device body comprises a wrap that is slipped onto the object. In some embodiments, the electromagnetic shielding device is coupled to an exterior of the object. In some embodiments, the electromagnetic shielding device is coupled with an interior of the object. In further embodiments, the electromagnetic shielding device is integrated within a cover of the object. In further embodiments, the electromagnetic shielding material comprises a plurality of embedded metal particles. In some embodiments, the second side comprises a transparent material which allows the electromagnetic radiation to pass through the second material. In some embodiments, the electromagnetic shielding material comprises a silver or copper laminate.

In another aspect, a system for shielding electromagnetic radiation produced by an object comprises a body comprising a first side comprising an electromagnetic shielding material, a second side opposite the first side comprising a transparent material and a coupling mechanism for coupling the body with the object, wherein the electromagnetic shielding material is configured to deflect electromagnetic radiation away from the object when the body is coupled with the object. In some embodiments, the object comprises an object worn by a user. In further embodiments, the object comprises one of a tablet, a smart phone and a computer. In some embodiments, the electromagnetic shielding material is configured to deflect electromagnetic radiation produced by one or more antennas of the of the object. In some embodiments, the coupling mechanism comprises an adhesive backing material for coupling with the object. In further embodiments, the coupling mechanism comprises a wrap formed by the first side and the second side that is slipped onto the object. In further embodiments, the electromagnetic shielding material comprises a plurality of embedded metal particles. In some embodiments, the electromagnetic shielding material comprises a silver or copper laminate.

In a further aspect, a cover for an electronic device comprises a cover body comprising an electromagnetic shielding material coupled to the cover body, wherein the electromagnetic shielding material is configured to deflect electromagnetic radiation away from the electronic device. In some embodiments, the electromagnetic shielding material is a component of the cover body. In some embodiments, the cover body removably couples with the electronic device. In some embodiments, the cover is installed during manufacturing of the electronic device. In some embodiments, the electronic device comprises one of a tablet, a smart phone and a computer.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures:

FIGS. 5A-5C illustrate a remote control device and system, in accordance with some embodiments.

FIGS. 6A-6C illustrate a remote control device and system, in accordance with some embodiments.

FIG. 9 illustrates an exploded view of a remote control device, in accordance with some embodiments.

FIG. 17 illustrates a remote control device and system, in accordance with some embodiments.

FIG. 18 illustrates a remote control device and system, in accordance with some embodiments.

FIG. 24 illustrates an earbud comprising electromagnetic shielding material for deflecting electro and electromagnetic radiation, in accordance with some embodiments.

FIG. 25 illustrates an earbud comprising electromagnetic shielding material for deflecting electro and electromagnetic radiation, in accordance with some embodiments.

FIG. 26 illustrates a set of earphones comprising electromagnetic shielding material for deflecting electro and electromagnetic radiation, in accordance with some embodiments.

DETAILED DESCRIPTION OF THE EMBODIMENTS

Embodiments of the invention are directed to an electromagnetic magnetic shielding material is used deflect electronic and electromagnetic radiation away from an electronic device. In this manner, the electromagnetic shielding material deflects the electronic and electromagnetic radiation from a user of the device to protect the user from any electronic and electromagnetic radiation produced by the electronic device. Additionally, because the electronic and electromagnetic radiation is deflected away from the user, rather than absorbed, a user is able to safely use the electronic device with less or no exposure to electronic and electromagnetic radiation.

Reference will now be made in detail to implementations of an EMF shielding material for an electronic device as illustrated in the accompanying drawings. In the interest of clarity, not all of the routine features of the implementations described herein are shown and described. It will be appreciated that in the development of any such actual implementation, numerous implementation-specific decisions can be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
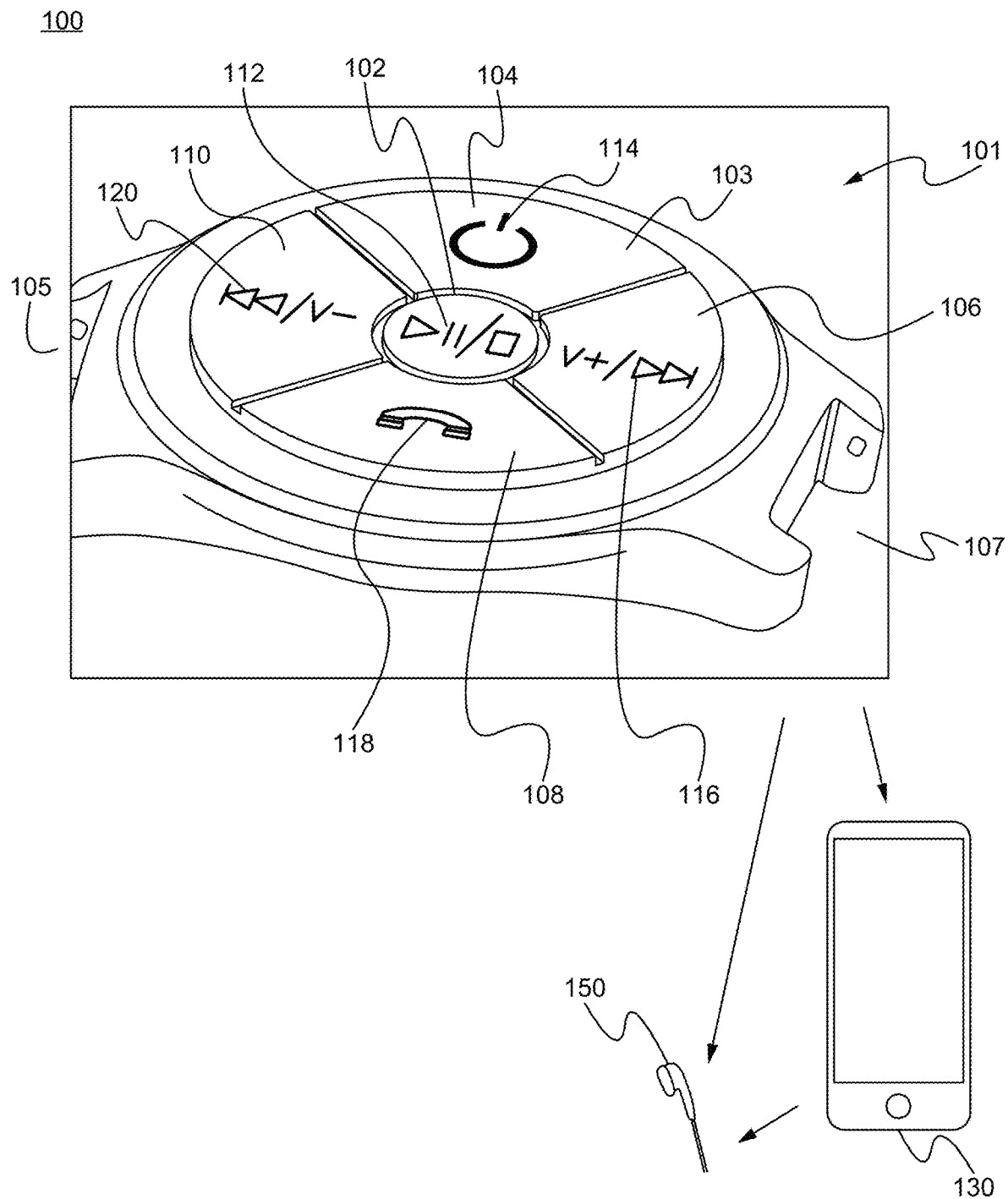
FIG. 1 illustrates a wearable remote control device, in accordance with some embodiments.

Referring now to FIG. 1, a wearable remote control device 100 is depicted therein. The wearable remote control device 100 is configured to communicate with a remotely located electronic device 130 and 150.

As shown within FIG. 1, the remote control device 100 comprises a substantially circular remote control body 101. In some embodiments, the remote control body 101 comprises a remote control face 103. The remote control face 103 comprises a first pressable control button 102 located within a center of the remote control face 103 and one or more additional pressable control buttons arranged in a circle around an outside of the first pressable control button 102. In some embodiments, the remote control face 103 comprises four additional pressable control buttons 104, 106, 108 and 110 equally spaced and arranged in a circle around an outside of the first pressable control button 102. However, the face of the remote control device 100 is able to comprise any appropriately desired number of pressable control buttons for communicating with a remotely located electronic device. Additionally, although a substantially circular body 101 is shown within FIG. 1, the body 101 is able to comprise any appropriately desired shape. For example, in some embodiments, the body 101 is square or rectangular shaped.

Figure 2:
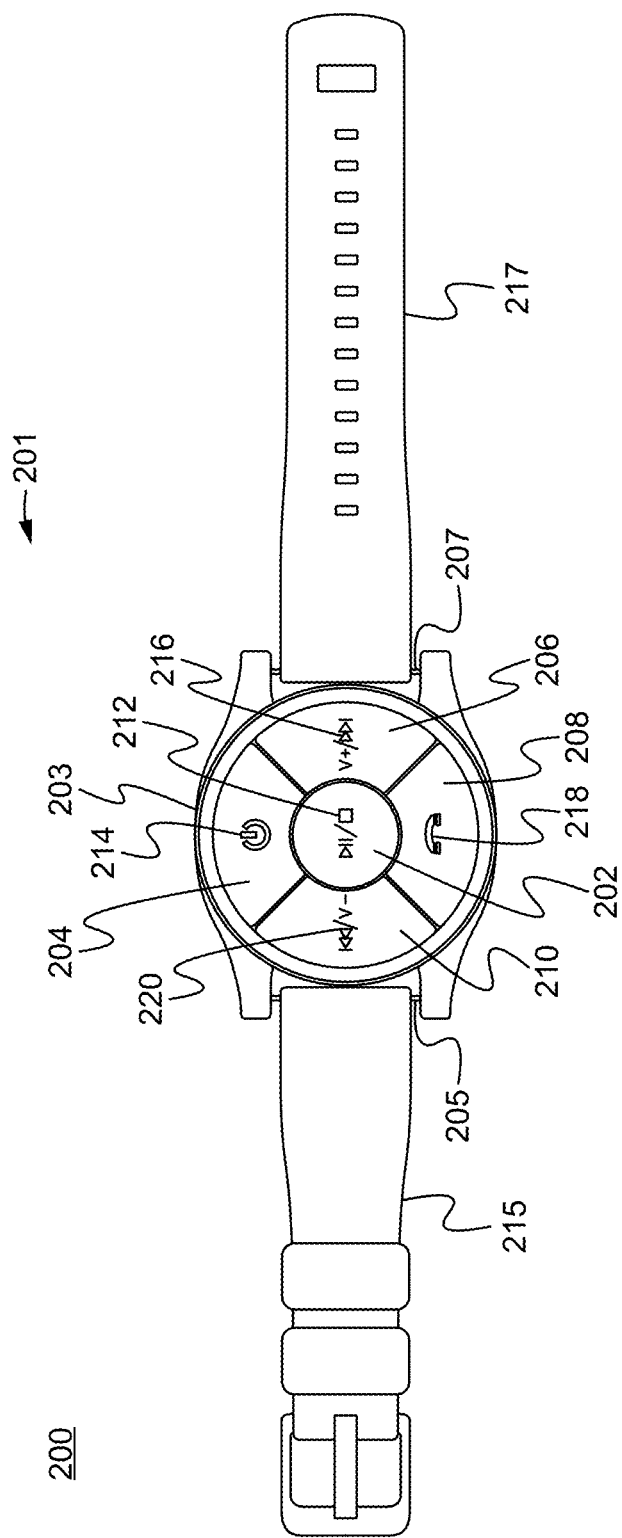
FIG. 2 illustrates a wearable system for communicating with a remotely located electronic device, in accordance with some embodiments.

As further shown in FIG. 1, in some embodiments, the remote control body 101 comprises a left side lug set 105 and a right side lug set 107. In some embodiments, the left side lug set 105 and the right side lug set 107 are used to couple the remote control body 101 with a strap for securing body 101 around an appendage of a user. In some embodiments, such as shown in FIG. 2, the strap comprise a left side strap and a right side strap. However, the strap is able to comprise any appropriately desired strap for securing the wearable remote control device 100 with an appendage of the user.

In some embodiments, the pressable buttons of the remote control face 103 each comprise separately clickably or pressable tactile or mechanical buttons. However, the pressable buttons of the remote control face 103 are able to comprise any appropriately desired separately clickable buttons. In some embodiments, the body 101 and the remote control face 103 comprises a rubber and/or a rubberized material. As further shown within FIG. 1, in some embodiments, the first pressable control button 102 and the one or more additional pressable control buttons each comprise a raised shape that is raised from the remote control face 103 that indicate a function of each button. For example, the center control button 102 comprises a raised shape 112 that indicates the center control button 102 plays, pauses or stops the remote control device 100 and/or the remotely located electronic device 130 and the set of earphones 150. Additionally, in some embodiments, the pressable button 104 comprises a raised shape 114 that powers on the remote control device 100 and/or the remotely located electronic device 130 and the set of earphones 150, the pressable button 106 comprises a raised shape 116 that indicates the button is a track forward or volume up button, the pressable button 108 comprises a raised shape 118 that indicates the button answers a phone call and the pressable button 110 comprises a raised shape 120 that indicates the button is a track backward or volume down button. Alternatively, in some embodiments, the first pressable control button 102 and the one or more additional pressable control buttons each comprise an impression indented into the remote control face 103 that indicate a function of each button, such as described above.

In some embodiments, the pressable buttons of the remote control face 103 comprise one or more of a start/pause control, a volume up control, a volume down control, a track forward button and a track backward button. In some embodiments, the pressable buttons of the remote control face 103 enable a user to control media and/or other music being played through a set of earphones 150 connected to the remotely located electronic device 130. In some embodiments, the pressable buttons of the remote control face 103 are configured to directly control the set of earphones 150. The set of earphones 150 are able to connect to the remotely located electronic device 130 using a wired and/or wireless or true wireless connection. In some embodiments, the remote control device 100 is wirelessly connected to the remotely located electronic device 130 and/or the set of earphones 150. However, the remote control device 100 is able to connect to the remotely located electronic device 130 and the set of earphones 150 in any appropriately desired manner.

In some embodiments, simultaneously pressing a plurality of buttons of the electronic the remote control device 100 enables the remote control device 100 to perform additional functions. For example, in some embodiments, simultaneously pressing two buttons of the remote control device 100 sends a signal to the remotely located electronic device 130 to take a photo. In some embodiments, simultaneously pressing two buttons of the remote control device 100 sends a signal to the remotely located electronic device 130 to begin recording video. In some embodiments, recording can be stopped by simultaneously pressing the same two buttons of the remote control device 100 to send a signal to the remotely located electronic device 130 to stop recording video. Particularly, the remote control device 100 is able to be programmed to perform any appropriately desired function for controlling the remotely located electronic device 130 and/or the set of earphones 150. In some embodiments, the electronic device 130 comprises a smart phone or media player. In some embodiments, the electronic device 130 comprises a personal video camera. However, the electronic device 130 is able to comprise any appropriately desired electronic device.

In further embodiments, such as shown in FIG. 1, the remote control device 100 comprises a microphone 140. In some embodiments, pressing and holding one or more of the pressable control buttons activates the microphone for receiving voice commands. For example, in some embodiments, pressing and holding the center button 102 activates the microphone to receive voice commands. Consequently, a user is able to then control the remotely located electronic device, such as described above, using voice commands. In some embodiments, pressing and holding one or more of the pressable control buttons activates the microphone so that the user is able to activate a virtual assistant connected to the remotely located electronic device 130. For example, a button of the remote control device 100 is able to be pressed and held to communicate with a virtual assistant such as Apple Siri®, Google Assistant®, Microsoft Cortana®, Amazon Alexa®, Samsung Bixby® or other similar virtual assistant.

FIG. 2 illustrates a wearable system for communicating with a remotely located electronic device. The wearable remote control device 200 is configured to communicate with a remotely located electronic device 130 and 150 (FIG. 1), such as described above.

As shown within FIG. 2, the system 200 comprises a substantially circular body 201. In some embodiments, the remote control body 201 comprises a remote control face 203. As described above, the remote control face 203 comprises a first pressable control button 202 located within a center of the remote control face 203 and one or more additional pressable control buttons arranged in a circle around an outside of the first pressable control button 202. In some embodiments, the remote control face 203 comprises four additional pressable control buttons 204, 206, 208 and 210 equally spaced and arranged in a circle around an outside of the first pressable control button 202. However, the face of the remote control device 200 is able to comprise any appropriately desired number of pressable control buttons for communicating with a remotely located electronic device. As further shown within FIG. 2, the system 200 comprises a left side strap 215 coupled to a left side of the body 201 and a right side strap 217 coupled to a right side of the body 201. In some embodiments, the remote control body 201 comprises a left side lug set 205 for coupling the left side strap 215 to a left side of the body 201 and a right side lug set 207 for coupling the right side strap 217 to a right side of the body 201. As described above, although a substantially circular body 201 is shown, the body 201 is able to comprise any appropriately desired shape. For example, in some embodiments, the body 201 is square or rectangular shaped.

As described above, in relation to the FIG. 1, in some embodiments, the pressable buttons of the remote control face 203 and the body 201 each comprise separately clickably or pressable tactile or mechanical buttons. However, the pressable buttons of the remote control face 203 are able to comprise any appropriately desired separately clickable buttons. In some embodiments, the body 201 and the remote control face 203 comprises a rubber and/or a rubberized material. As further shown within FIG. 2, in some embodiments, the first pressable control button 202 and the one or more additional pressable control buttons each comprise a raised shape that is raised from the remote control face 203 that indicate a function of each button. For example, the center control button 202 comprises a raised shape 212 that indicates the center control button 202 plays, pauses or stops the remote control device 200 and/or the remotely located electronic device and the set of earphones (FIG. 1). Additionally, in some embodiments, the pressable button 204 comprises a raised shape 214 that indicates the button that powers on the remote control device 100 and/or the remotely located electronic device 130 and the set of earphones 150, the pressable button 206 comprises a raised shape 216 that indicates the button is a track forward or volume up button, the pressable button 208 comprises a raised shape 218 that indicates the button answers a phone call and the pressable button 210 comprises a raised shape 220 that indicates the button is a track backward or volume down button. Alternatively, in some embodiments, the first pressable control button 202 and the one or more additional pressable control buttons each comprise an impression indented into the remote control face 203 that indicate a function of each button, such as described above.

In some embodiments, the pressable buttons of the remote control face 203 comprise one or more of a start/pause control, a volume up control, a volume down control, a track forward button and a track backward button. In some embodiments, the pressable buttons of the remote control face 203 enable a user to control media and/or other music being played through a set of earphones connected to the remotely located electronic device. In some embodiments, the pressable buttons of the remote control face 203 are configured to directly control the set of earphones. The set of earphones are able to connect to the remotely located electronic device using a wired and/or wireless connection. In some embodiments, the system 200 is wirelessly connected to the remotely located electronic device and/or the set of earphones. However, the system 200 is able to connect to the remotely located electronic device and the set of earphones in any appropriately desired manner.

As described above, in some embodiments, simultaneously pressing a plurality of buttons of the electronic the system 200 enables the system 200 to perform additional functions. For example, in some embodiments, simultaneously pressing two buttons of the system 200 sends a signal to the remotely located electronic device to take a photo. In some embodiments, simultaneously pressing two buttons of the system 200 sends a signal to the remotely located electronic device to begin recording video. In some embodiments, recording can be stopped by simultaneously pressing the same two buttons of the system 200 to send a signal to the remotely located electronic device to stop recording video. Particularly, the system 200 is able to be programmed to perform any appropriately desired function for controlling the remotely located electronic device and/or the set of earphones. In some embodiments, the system 200 comprises a smart phone or media player. In some embodiments, the electronic device comprises a personal video camera. However, the electronic device is able to comprise any appropriately desired electronic device.

As described above, the remote control device 200 comprises a microphone 240. In some embodiments, pressing and holding one or more of the pressable control buttons activates the microphone for receiving voice commands. For example, in some embodiments, pressing and holding the center button 202 activates the microphone to receive voice commands. Consequently, a user is able to then control the remotely located electronic device, such as described above, using voice commands. In some embodiments, pressing and holding one or more of the pressable control buttons activates the microphone so that the user is able to activate a virtual assistant connected to the remotely located electronic device (FIG. 1). For example, a button of the remote control device 200 is able to be pressed and held to communicate with a virtual assistant such as Apple Siri®, Google Assistant®, Microsoft Cortana®, Amazon Alexa®, Samsung Bixby® or other similar virtual assistant.

Figure 3:
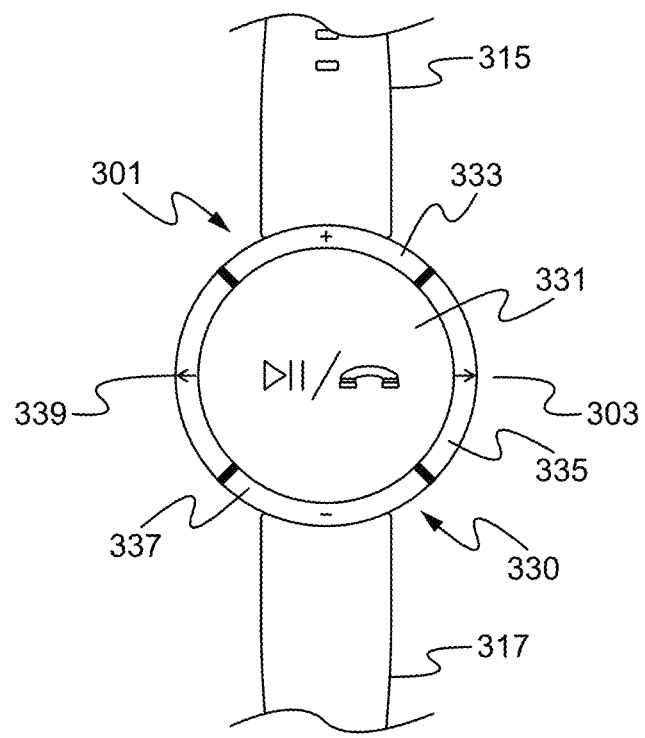
FIG. 3 illustrates a wearable system for communicating with a remotely located electronic device, in accordance with some embodiments.

FIG. 3 illustrates a wearable system for communicating with a remotely located electronic device. The wearable remote control device 300 is configured to communicate with a remotely located electronic device 130 and 150 (FIG. 1), such as described above.

As shown within FIG. 3, the system 300 comprises a substantially circular body 301. In some embodiments, the remote control body 301 comprises a remote control face 303. As shown within FIG. 3, the body 301 comprises a middle pressable control button 331 and one or more outside pressable control buttons arranged in a circle around an outside of the middle pressable control button 331 and within an exterior ring 330 of the remote control face 303 and body 301. In some embodiments, the remote control face 303 comprises four outside pressable control buttons 333, 335, 337 and 339 equally spaced and arranged in a circle around an outside of the middle pressable control button 331. However, the face 303 of the remote control device 300 is able to comprise any appropriately desired number of pressable control buttons for communicating with a remotely located electronic device. As further shown within FIG. 3, the system 300 comprises a left side strap 315 coupled to a left side of the body 301 and a right side strap 317 coupled to a right side of the body 301. In some embodiments, the remote control body 301 comprises a left side lug set for coupling the left side strap 315 to a left side of the body 301 and a right side lug set for coupling the right side strap 317 to a right side of the body 301, such as described above. As described above, the body 301 is able to comprise any appropriately desired shape. For example, in some embodiments, the body 301 is square or rectangular shaped.

As described above, in relation to the FIGS. 1 and 2, in some embodiments, the pressable buttons of the remote control face 303 and the body 301 each comprise separately clickably or pressable tactile or mechanical buttons. However, the pressable buttons of the remote control face 303 are able to comprise any appropriately desired separately clickable buttons. In some embodiments, the body 301 and the remote control face 303 comprises a rubber and/or a rubberized material.

As further shown within FIG. 3, in some embodiments, the middle pressable control button 331 and the one or more outside pressable control buttons each comprise a raised shape that is raised from the remote control face 303 that indicate a function of each button, such as described above. Alternatively, in some embodiments, the middle pressable control button 331 and the one or more outside pressable control buttons each comprise an impression indented into the remote control face 303 that indicate a function of each button, such as described above.

In some embodiments, the pressable buttons of the remote control face 303 comprise one or more of a start/pause control, a volume up control, a volume down control, a track forward button and a track backward button. In some embodiments, the pressable buttons of the remote control face 303 enable a user to control media and/or other music being played through a set of earphones connected to the remotely located electronic device. In some embodiments, the pressable buttons of the remote control face 303 are configured to directly control the set of earphones. The set of earphones are able to connect to the remotely located electronic device using a wired and/or wireless connection. In some embodiments, the system 300 is wirelessly connected to the remotely located electronic device and/or the set of earphones. However, the system 300 is able to connect to the remotely located electronic device and the set of earphones in any appropriately desired manner.

As described above, in some embodiments, simultaneously pressing a plurality of buttons of the electronic the system 300 enables the system 300 to perform additional functions. For example, in some embodiments, simultaneously pressing two buttons of the system 300 sends a signal to the remotely located electronic device to take a photo. In some embodiments, simultaneously pressing two buttons of the system 300 sends a signal to the remotely located electronic device to begin recording video. In some embodiments, recording can be stopped by simultaneously pressing the same two buttons of the system 300 to send a signal to the remotely located electronic device to stop recording video. Particularly, the system 300 is able to be programmed to perform any appropriately desired function for controlling the remotely located electronic device and/or the set of earphones. In some embodiments, the system 300 comprises a smart phone or media player. In some embodiments, the electronic device comprises a personal video camera. However, the electronic device is able to comprise any appropriately desired electronic device.

In some embodiments, the devices and systems, such as described above comprises an appropriately desired waterproof and/or wind-proof case protect against the outside elements. Particularly, the devices and systems are able to be used in an open environment when the remotely located electronic device is placed within a pocket and other secure location. Additionally, because in some embodiments the devices and systems use mechanically clickable buttons, the devices and systems are able to be used while the user is wearing gloves and are easily pushed and manipulated by a user.

Figure 4:
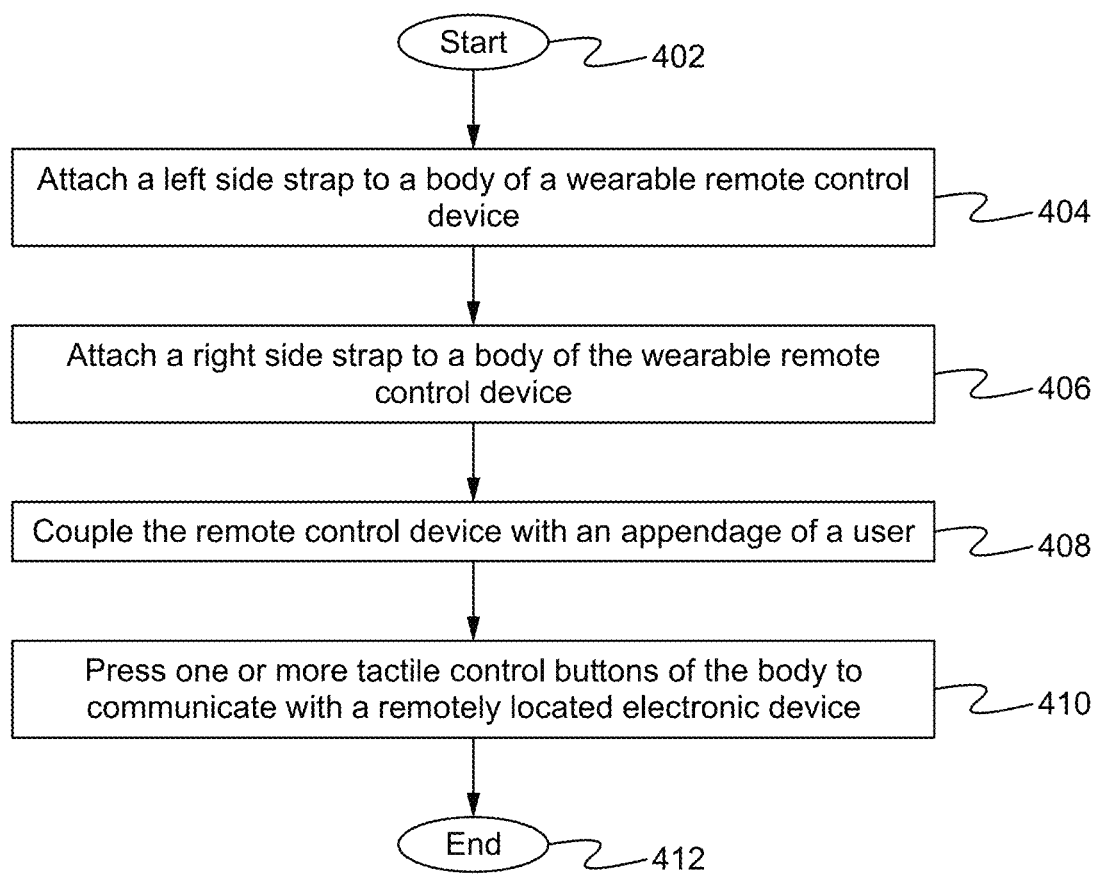
FIG. 4 illustrates a method of utilizing a wearable remote control device, in accordance with some embodiments.

FIG. 4 illustrates a method of utilizing a remote control in accordance to some embodiments. In some embodiments, the remote control comprises a remote control device and system, such as described above. The method begins in the step 402. In the step 404, a left side strap is attached to a substantially circular body of the wearable remote control device. In the step 406, a right side strap is attached to the substantially circular body of the wearable remote control device. Then in the step 408, the wearable remote control device is coupled with an appendage of a user and in the step 410 one or more tactile control buttons of the body are pressed to communicate with the remotely located electronic device. The method ends in the step 412.

Referring now to FIGS. 5A-5C, a remote control device and system is depicted therein. The remote control device and system 500 enables a band mounted electronic device controller to control a remotely located electronic device. As shown within FIG. 5A, the device and system comprises a body 501 comprising a circular wrap. The body 501 comprising a circular wrap is configured to continuously wrap around an entire circumference of a user. For example, in some embodiments, the body 501 is configured to wrap around a wrist and/or an arm of a user. However, the body 501 is able to wrap around any appropriately desired appendage such as a leg, calf or other appendage. An electronic device controller 510 is embedded within and/or removably coupled to the body 501. The electronic device controller 510 is configured to communicate with and/or control a remotely located electronic device 530, such as shown within FIG. 5B. In some embodiments, the electronic device 530 comprises a smart phone or media player. In some embodiments, the electronic device 530 comprises a personal video camera. However, the electronic device 530 is able to comprise any appropriately desired electronic device.

In some embodiments, the electronic device controller 510 comprises one or more controls for controlling the remotely located electronic device 530. For example, in some embodiments, the electronic device controller 510 comprises a start/pause control 515, a volume up control 511, a volume down control 513, a track forward button 512 and a track backward button 514. Particularly, in some embodiments, the controller 510 enables a user to control media and/or other music being played through a set of earphones 550 connected to the remotely located electronic device 530. The set of earphones 550 are able to connect to the remotely located electronic device 530 using a wired and/or wireless connection. In some embodiments, the electronic device controller 510 is wirelessly connected to the remotely located electronic device 530. However, the electronic device controller 510 is able to connect to the remotely located electronic device 530 in any appropriately desired manner.

In some embodiments, simultaneously pressing a plurality of buttons of the electronic device controller 510 enables the controller 510 to perform additional functions. For example, in some embodiments, simultaneously pressing two buttons of the controller 510 sends a signal to the remotely located electronic device 530 to take a photo. In some embodiments, simultaneously pressing two buttons of the controller 510 sends a signal to the remotely located electronic device 530 to begin recording video. In some embodiments, the controller 510 comprises a light which indicates that the remotely located electronic device 530 is recording a video. In some embodiments, recording can be stopped by simultaneously pressing the same two buttons of the controller 510 to send a signal to the remotely located electronic device 530 to stop recording video. Particularly, the controller 510 is able to be programmed to perform any appropriately desired function for controlling the remotely located electronic device.

Referring now to FIGS. 6A-6C, a remote control device and system is depicted therein. The remote control device and system 600 enables a band mounted electronic device controller to control a remotely located electronic device. As shown within FIG. 6A, the device and system comprises a body 601 comprising a circular wrap. The body 601 comprising a circular wrap is configured to continuously wrap around an entire circumference of a user. For example, in some embodiments, the body 601 is configured to wrap around a wrist and/or an arm of a user. However, the body 601 is able to wrap around any appropriately desired appendage such as a leg, calf or other appendage. An electronic device controller 610 is embedded within and/or removably coupled to the body 601. The electronic device controller 610 is configured to communicate with and/or control a remotely located electronic device 630, such as shown within FIG. 6B. In some embodiments, the electronic device 630 comprises a smart phone or media player. In some embodiments, the electronic device 630 comprises a personal video camera. However, the electronic device 630 is able to comprise any appropriately desired electronic device.

In some embodiments, the electronic device controller 610 comprises one or more controls for controlling the remotely located electronic device 630. For example, in some embodiments, the electronic device controller 610 comprises a start/pause control 615, a power on/off button 611, a phone control button 613, a speaker 619, a track forward button 612 and a track backward button 615. Particularly, in some embodiments, the controller 610 enables a user to control media and/or other music being played through a set of earphones 650 connected to the remotely located electronic device 630. The set of earphones 650 are able to connect to the remotely located electronic device 630 using a wired and/or wireless connection. In some embodiments, the electronic device controller 610 is wirelessly connected to the remotely located electronic device 630. However, the electronic device controller 610 is able to connect to the remotely located electronic device 630 in any appropriately desired manner.

In some embodiments, simultaneously pressing a plurality of buttons of the electronic device controller 610 enables the controller 610 to perform additional functions. For example, in some embodiments, simultaneously pressing two buttons of the controller 610 sends a signal to the remotely located electronic device 630 to take a photo and/or begin recording video. In some embodiments, the controller 610 comprises a light which indicates that the remotely located electronic device 630 is recording a video. In some embodiments, recording can be stopped by simultaneously pressing the same two buttons of the controller 610 to send a signal to the remotely located electronic device 630 to stop recording video.

As shown within FIGS. 5A-5C and FIGS. 6A-6C, the remote control devices and systems 500 and 600 comprise one or more controls for controlling a remotely located electronic device. Particularly, the remote control devices and systems 500 and 600 are able to comprise any appropriately desired control buttons for controlling a remotely located electronic device. Additionally, the buttons are able to be placed within any appropriately desired location and/or orientation on the electronic device controllers. In some embodiments, the electronic device controllers comprise touch screen controls.

Figure 7:
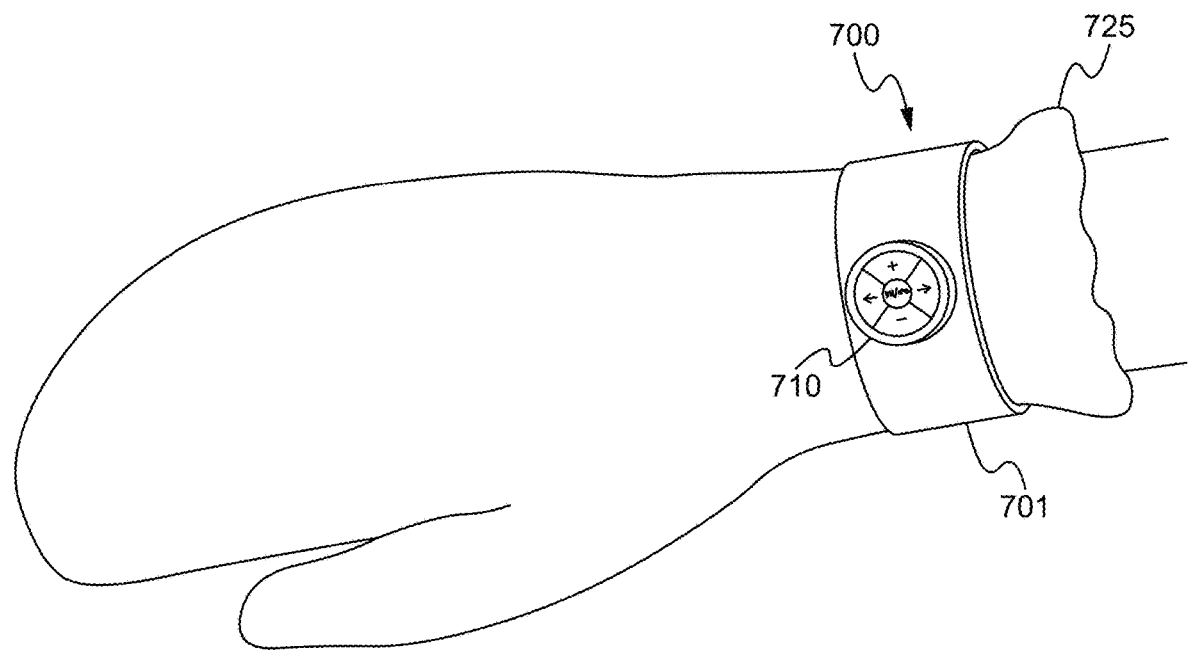
FIG. 7 illustrates a remote control device and system, in accordance with some embodiments.

In some embodiments, such as shown within FIG. 7, the band and/or body 701 of the remote control device and system 700 is configured to fit around a glove or mitten 725 of a user. In some embodiments, the band and/or body 701 of the remote control device and system 700 is configured to fit around a jacket or other piece of clothing. Particularly, the band and/or body 701 of the remote control device and system 700 is able to fit around any desired article as appropriately desired. Consequently, the user is able to use the remote control device and system 700 in a cold weather atmosphere to control a remotely located electronic device. For example, the user is able to use the remote control device and system 700 to easily take pictures and/or video, such as described above, without removing their gloves or mitten. In some embodiments, the body 701 is stretchable to stretch around the glove or mitten of a user and then retracts tight against the glove or mitten. In some embodiments, the body 701 continuously wraps around an entire circumference of the glove or mitten and connects by hook and loop material or other appropriately desired fastening mechanism. Alternatively, in some embodiments, the body 701 continuously wraps around an entire circumference of the glove or mitten and is able to be cinched tightly and securely around the glove or mitten by an appropriately desired mechanism. In some embodiments, the body 701 comprises an appropriately desired waterproof and/or wind-proof fabric to protect against the outside elements.

Figure 8:
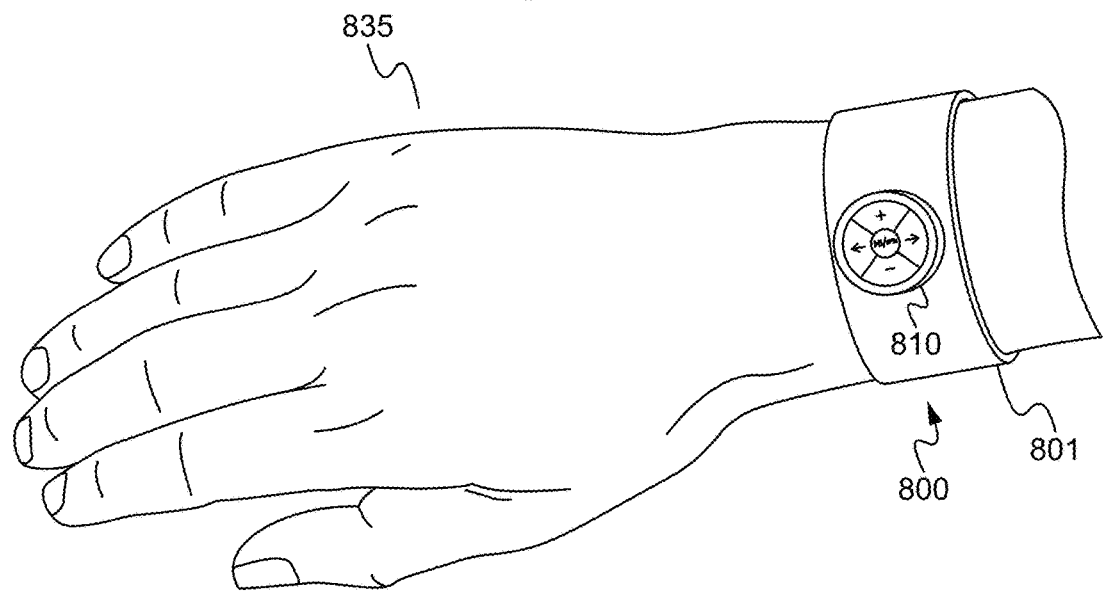
FIG. 8 illustrates a remote control device and system, in accordance with some embodiments.

In further embodiments, such as shown in FIG. 8, the band and/or body 801 of the remote control device and system 800 is configured to fit directly around a wrist 835 of a user. In some of these embodiments, the body 801 is able to comprise a mesh absorbent or wicking material. Consequently, the user is able to use the remote control device and system 800 while engaging in activity or in hot weather where the user might encounter perspiration. The band 801 is then able to absorb the perspiration or other moisture and still remain comfortable while being worn by the user. As described above, in some embodiments, the body 801 is stretchable to stretch around the glove or mitten of a user and then retracts tight against the glove or mitten. In some embodiments, the body 801 continuously wraps around an entire circumference of the wrist or arm and connects by a hook and loop material, Velcro®, buttons or other appropriately desired fastening mechanism. Alternatively, in some embodiments, the body 801 continuously wraps around an entire circumference of the wrist or arm and is cinched tightly and securely around the wrist or arm by an appropriately desired mechanism.

FIG. 9 illustrates an exploded view of a remote control device, such as described above, in accordance with some embodiments. As shown within FIG. 9, the remote control device 900 comprises a substantially circular remote control body 901. In some embodiments, the remote control body 901 comprises a remote control face 903 comprising one or more pressable control buttons for communicating with a remotely located electronic device. As shown in FIG. 9, the remote control device 900 comprises a frame 991 for framing the remote control face 903 and a circuit board 993 comprising one or more internal electronics for controlling the remote control device 900. As shown within FIG. 9, in some embodiments, electronics of the circuit board 993 are embedded into and flush with the circuit board 993 and surround a battery 992 of the remote control device 900. As described above, the body 901 is able to comprise any appropriately desired shape. For example, in some embodiments, the body 901 is square or rectangular shaped.

In some embodiments, the remote control device 900 comprises a charging port 995 for charging the remote control device 900. In some embodiments, the remote control device 900 comprises a cover 997 is removable to access a cutout 999 to access the charging port 995 of the body 901. In some embodiments, the remote control device 900 is charged is using one of a micro-usb and a usb connection. However, the remote control device is able to be charged using any appropriately desired mechanism.

As further shown within FIG. 9, the remote control device 900 comprises a battery 992 which fits within a cutout 994 of the body 901. The battery 992 is specifically designed and configured to fit within the body 901 to enable the body 901 to have a slimmer profile than if a traditional battery were used. Particularly, the battery 992 is slimmer than a traditional watch battery, which enables the remote control device 900 to have a slim and comfortable profile. Additionally, the battery 992 is configured with a greater amount of power than a traditional battery. For example, a traditional watch sized battery is typically 3.2 mm to 5.5 mm high by 20 mm in diameter and is able to generate 6 hours of power.

In some embodiments, the battery 992 is 2.5 mm high by 21 mm in diameter and is able to generate 48 hours of power. In some embodiments, the battery 992 is square and is able to withstand temperatures down to negative 20° Fahrenheit and up to positive 140° Fahrenheit.

Figure 10:
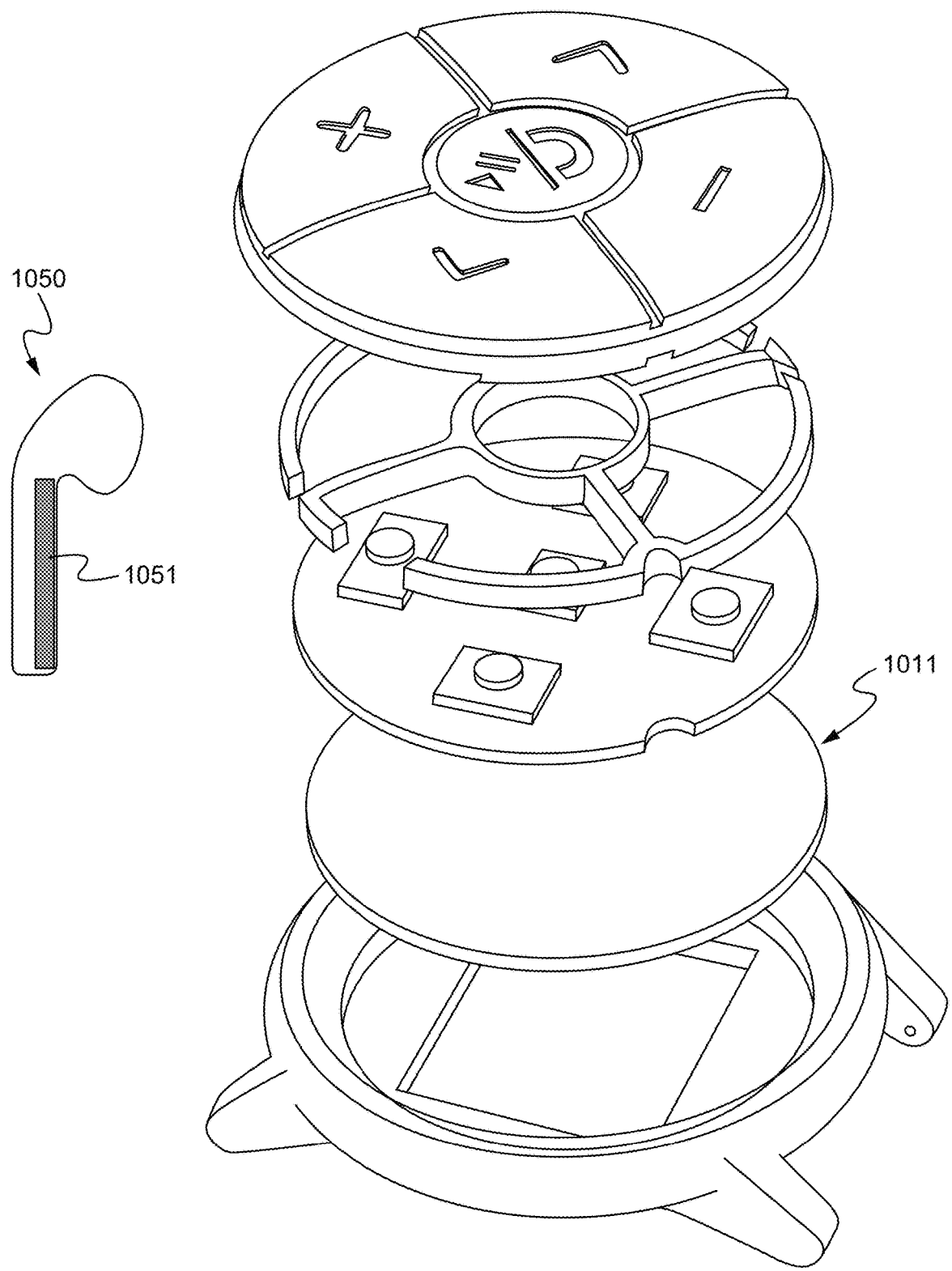
FIG. 10 illustrates an exploded view of a remote control device and system, in accordance with some embodiments.

FIG. 10 illustrates an exploded view of a remote control device, such as described above, in accordance with further embodiments. As shown within FIG. 10, in some embodiments, the remote control device 1000 comprises a layer of electric and electromagnetic radiation (EMF) shielding material 1011. The NEMKO lab tested and certified EMF shielding material 1011 shields EMF radiation generated by the remote control device 900 from the user device. In some embodiments, the remote control device 1000 is used with headphones 1050 comprising NEMKO lab tested and certified EMF shielding material 1051 for shielding EMF radiation generated by the headphones 1050.

Figure 11:
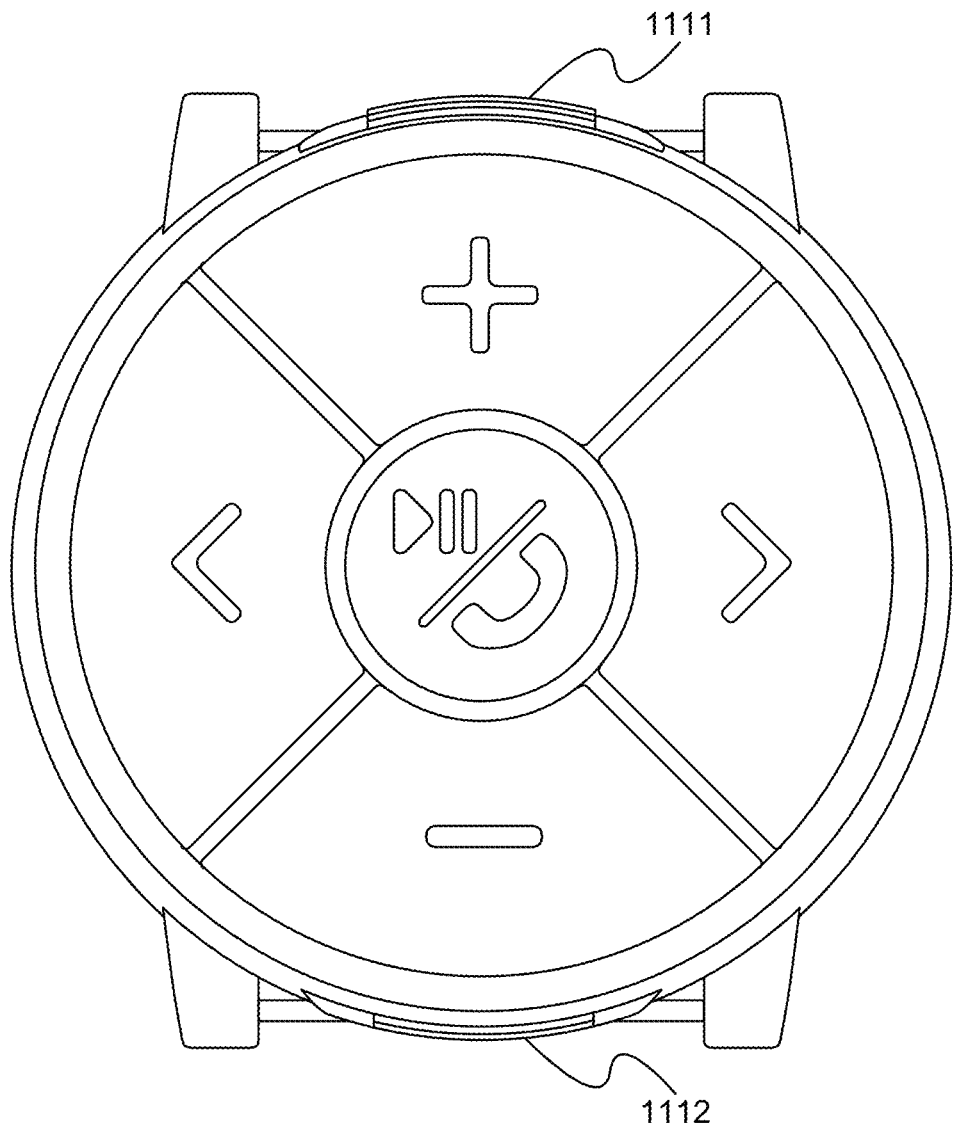
FIG. 11 illustrates a remote control device and system, in accordance with some embodiments.

As described above, in some embodiments, simultaneously pressing two buttons of the remote control device sends a signal to the remotely located electronic device to begin recording video. For example, such as shown within FIG. 11, in some embodiments, simultaneously pressing a top button 1111 and a bottom button 1112 of the remote control device 1100 to control a video camera or other device capable of taking video. In this manner, the top button 1111 and a bottom button 1112 are each pressed such as indicated within FIG. 11 to send a signal to the remotely located electronic device to start recording, stop recording, take a still picture and control the video camera or other remotely located electronic device, such as described above.

Figure 12:
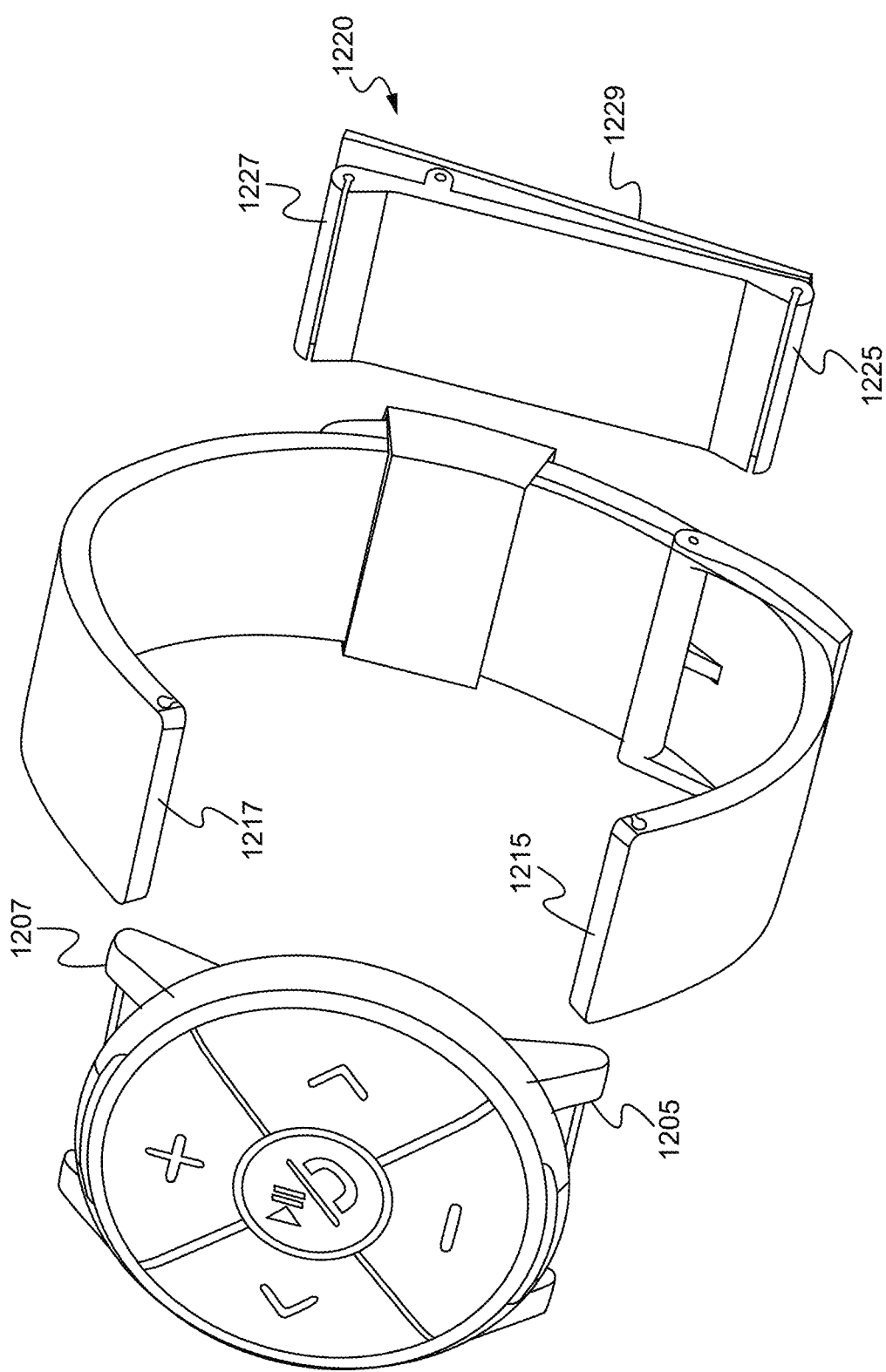
FIG. 12 illustrates a remote control device and system, in accordance with some embodiments.

As further described above, and as further shown within FIG. 12, in some embodiments, the remote control device 1200 comprises a left side lug set 1205 for coupling the left side strap 1215 to a left side lug set 1205 of the remote control device 1200 and a right side lug set 1207 for coupling the right side strap 1217 to a right side of the remote control device 1200. Particularly, the remote control device 1200 is able to utilize attachment devices such as a carabineer, a lanyard, a key chain and other appropriately desired attachment devices. For example, such as shown within FIG. 12, in some embodiments, a clip 1229 is able to couple with the remote control device 1200 by coupling a left side attachment 1215 to a left side lug set 1205 of the remote control device 1200 and a right side lug set 1207 for coupling the right side strap 1217 to a right side of the remote control device 1200.

Figure 13:
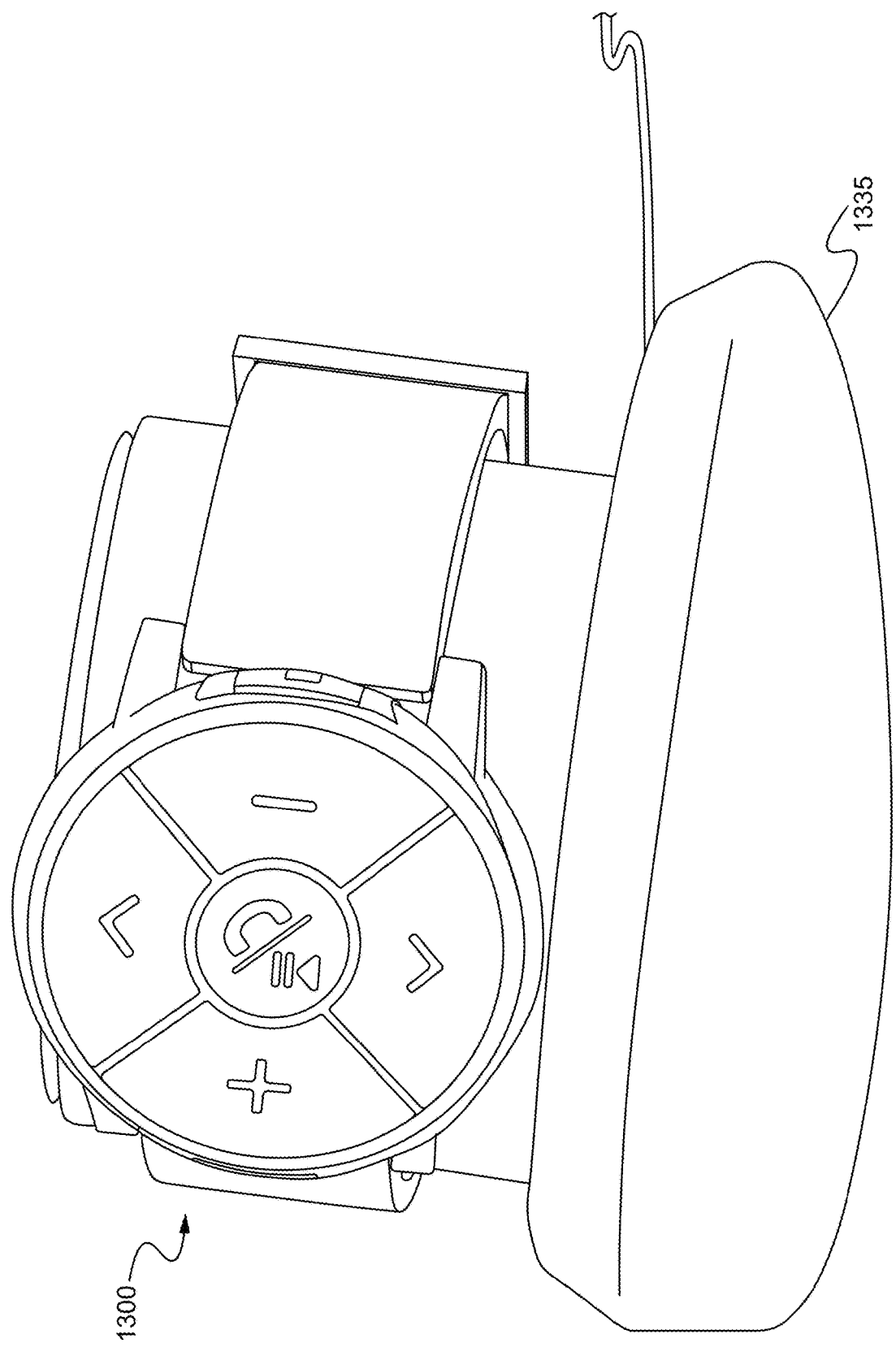
FIG. 13 illustrates a remote control device and system, in accordance with some embodiments.

FIG. 13 illustrates a remote control device 1300 coupled to a wireless charging station 1335 for charging the remote control device 1300. As described above, in some embodiments, the remote control device 1300 is able to be charged in a wired manner using one of micro-usb and a usb connection. However, the remote control device 1300 is able to be charged in any appropriately desired wired and wireless manner.

Figure 14:
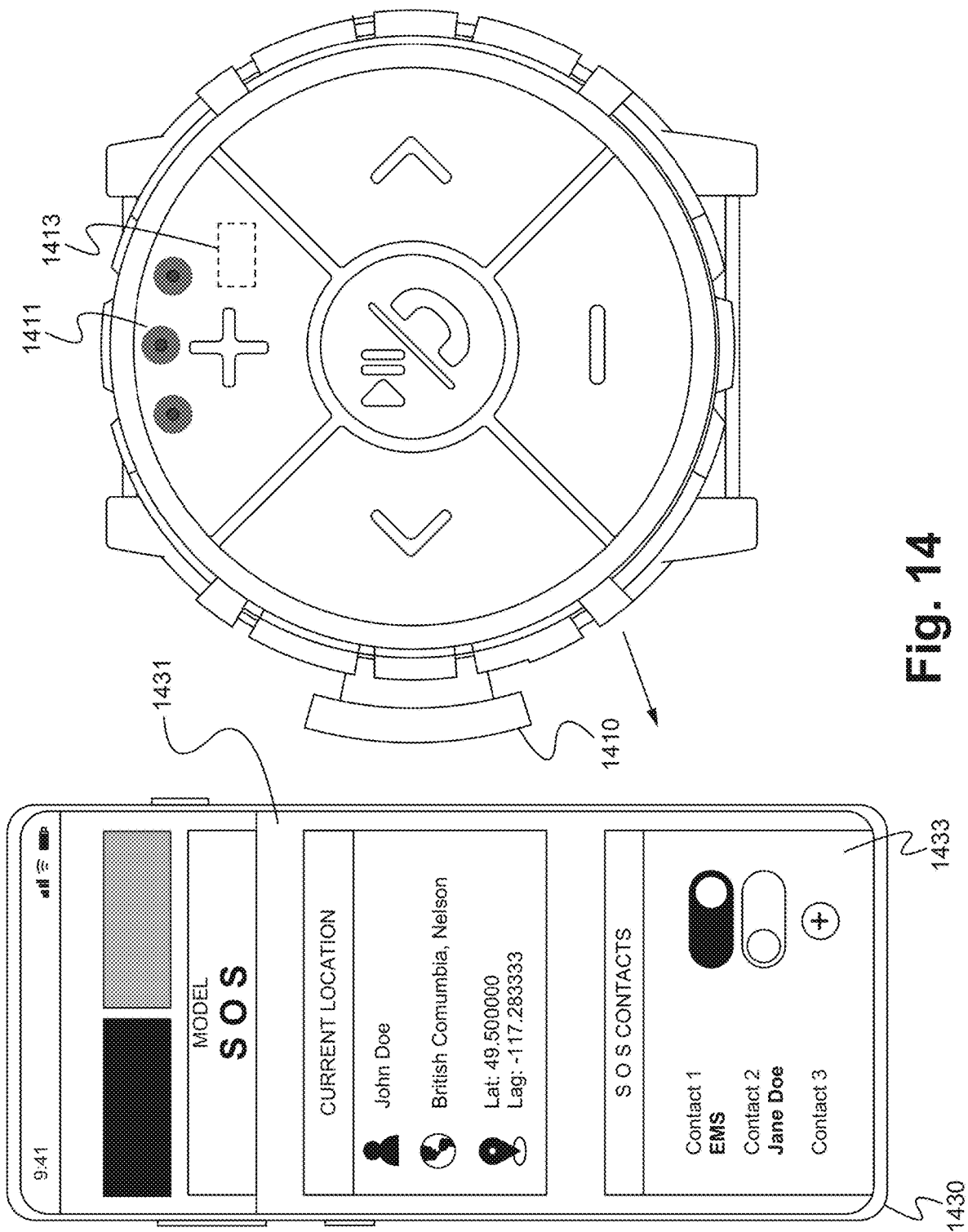
FIG. 14 illustrates a remote control device and system, in accordance with some embodiments.

In further embodiments, the remote control device is able to communicate with an application stored on a memory of a remotely controlled device. As shown within FIG. 14, the remote control device 1400 comprises a pullable button 1410 which is pulled outward to send an alert indicating the location of the remote control device 1400 through an application stored on an electronic device 1430. For example, a user is able to enter one or more contacts 1433 into an application and when the pullable button is pulled outward an alert indicating the location of the remote control device 1400 is sent through an application stored on an electronic device 1430 to the one or more entered contacts 1433. In some embodiments, the remote control device 1400 comprises a GPS or GNSS antenna 1413 for sending a location 1431 of the remote control device 1400 through the application stored on the electronic device 1430. In some embodiments, the electronic device 1430 comprises a GPS or GNSS antenna for sending a location through the application stored on the electronic device 1430.

In some embodiments, an alert 1411 is also generated at the remote control device 1400 to indicate that an alert has been sent through the application on the electronic device 1430. Particularly, in some embodiments, a location of the remote control device 1400 and the user can be engaged through the application and one ore more contacts can be designated. In this manner, a SOS alert can be sent to custom contacts such as emergency services, family, friends or other custom contacts by sending a location of the remote control device 1400 through the application. Additionally, although a pullable button 1410 is shown within FIG. 14 to send an alert indicating the location of the remote control device 1400, any appropriately desired pressable and/or pullable button or combination of pressable and/or pullable buttons of the remote control device 1400 is able to be used to send the location signal.

Figures 15A, 15B:
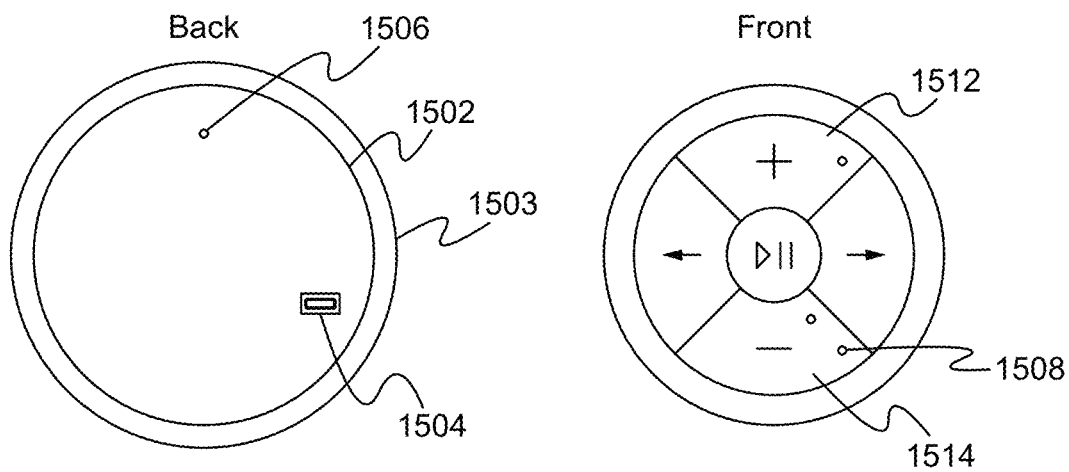
FIGS. 15A and 15B illustrate an electronic device controller, in accordance with some embodiments.

FIGS. 15A and 15B illustrate an electronic device controller, in accordance with some embodiments. FIG. 15A illustrates a back side of the electronic device controller. As shown within FIG. 15A, in some embodiments, the back side 1502 of the electronic device controller shows a wireless connectivity status 1506. In further embodiments, the controller comprises a charging port 1504 for recharging the controller. As described above, the electronic device controller is able to connect to the remotely located electronic device by any appropriately desired wireless method. Additionally, although a charging port 1504 is shown within FIG. 15A in some embodiments, the controller is battery powered. Particularly, the controller is able to be powered by any appropriately desired power method. As further shown in FIG. 15A, in some embodiments, the electronic device controller comprises a lip or ring 1503, which enables the controller to mount to the band, such as described below.

As shown in FIG. 15B, the front sides of the electronic device controller comprise one or more controls for controlling a remotely located electronic device. As described above, the remote control is able to comprise any appropriately desired control buttons for controlling a remotely located electronic device. Additionally, the buttons are able to be placed within any appropriately desired location and/or orientation on the electronic device controller. In some embodiments, the electronic device controller comprises touch screen controls. As described above, the electronic device controller is configured to communicate with and/or control a remotely located electronic device, such as a smart phone, media player, personal video camera or other appropriately desired device. As further shown within FIG. 15B, in some embodiments, the controller comprises a LED light 1508 which stays lit when a video is recording and blinks blue when connecting to the remotely located electronic device. As described above, in some embodiments, simultaneously pressing two buttons of the controller sends a signal to control the remotely located electronic device. For example, in some embodiments, simultaneously pressing two buttons of the controller sends a signal to control the remotely located electronic device to take a photo and/or begin recording video. Additionally, in some embodiments, holding a button, rather than pressing the button sends a signal to control the remotely located electronic device. In some embodiments, holding the button 1512 sends a signal to the electronic device to activate a digital assistant and/or voice commands for the electronic device. For example, holding the button 1512 sends a signal to the electronic device that then enables the user to ask the electronic device a question such as "what is the temperature," or perform a voice command such as "call dad." Particularly, the controller is able to be programmed to send any appropriately desired control command to the remotely located electronic device.

Figures 16A, 16B:
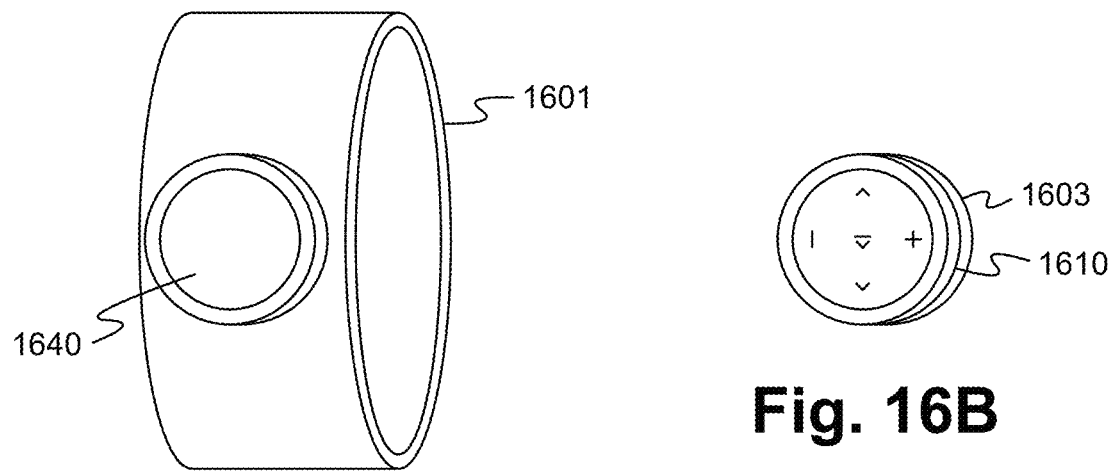
FIG. 16A-16C illustrate a remote control device and system, in accordance with some embodiments.

As shown within FIGS. 16A and 16B, in some embodiments, the electronic device controller 1610 is shown removably coupled to the body 1601. In some embodiments, the electronic device controller 1610 is able to removably couple with one of a plurality of bodies one at a time, such that the electronic device controller 1610 is configured to separately couple with each of the plurality of bodies. As shown within FIG. 16A, in some embodiments, the electronic device controller 1610 is configured to removably couple with a cavity 1640 of the body 1601. As described above, in some embodiments, the electronic device controller 1610 comprises a lip or ring 1603, which enables the controller 1610 to couple with a lip or ring 1645 of the cavity 1640.

Figure 16C:
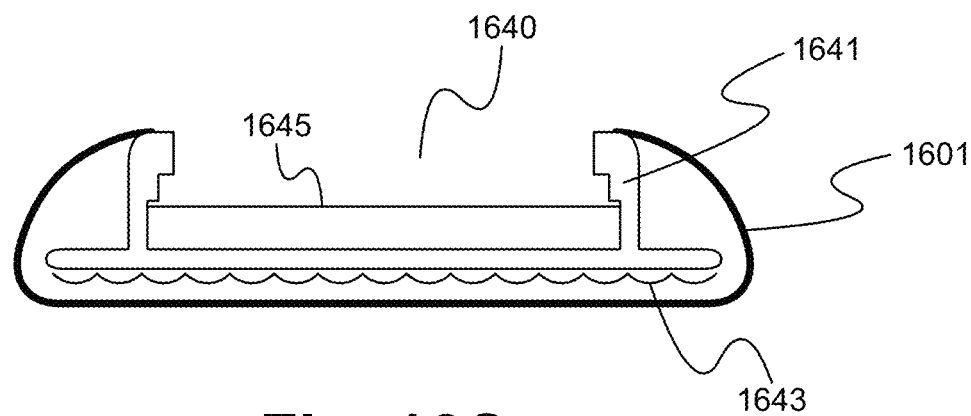

As shown within FIG. 16C, in some embodiments, the cavity 1640 comprises one or more indentation features 1641 which further hold the controller 1610 and enable the controller to sit flush inside the cavity 1640. In some embodiments, the cavity 1640 comprises a silicon mount. In some embodiments, the cavity 1640 couples to an outside of the body 1601 by flexible glue or stitching 1643. However, the cavity 1640 and the controller 1610 are able to couple to the body 1601 by any appropriately desired mechanism as known within the art. In some embodiments, the controller 1610 is able to be embedded within a surface of the body 1601.

As shown within FIG. 17, in some embodiments, the body 1701 is able to comprise a hook and loop fastening system for attaching two sides of the body 1701 to couple the body 1701 around an appendage of a user. As shown within FIG. 17, the body 1701 comprises a first side 1702 and a second side 1704 comprising a hook and loop fastening system which enables to the body 1701 to be fastened to an appropriate size around the user's appendage. In some embodiments, the body 1701 comprises an appropriately desired waterproof and/or wind-proof fabric to protect against the outside elements. As described above, the controller 1710 is able to couple and/or removably couple with the body using any appropriately desired mechanism as desired.

As shown within FIG. 18, the body 1801 is configured to fit directly around an appendage of a user. As described above, in some of these embodiments, the body 1801 comprises a mesh absorbent or wicking material. The body 1801 is then able to absorb the perspiration or other moisture and still remain comfortable while being worn by the user. As described above, the controller 1810 is able to couple and/or removably couple with the body using any appropriately desired mechanism as desired.

Figure 19:
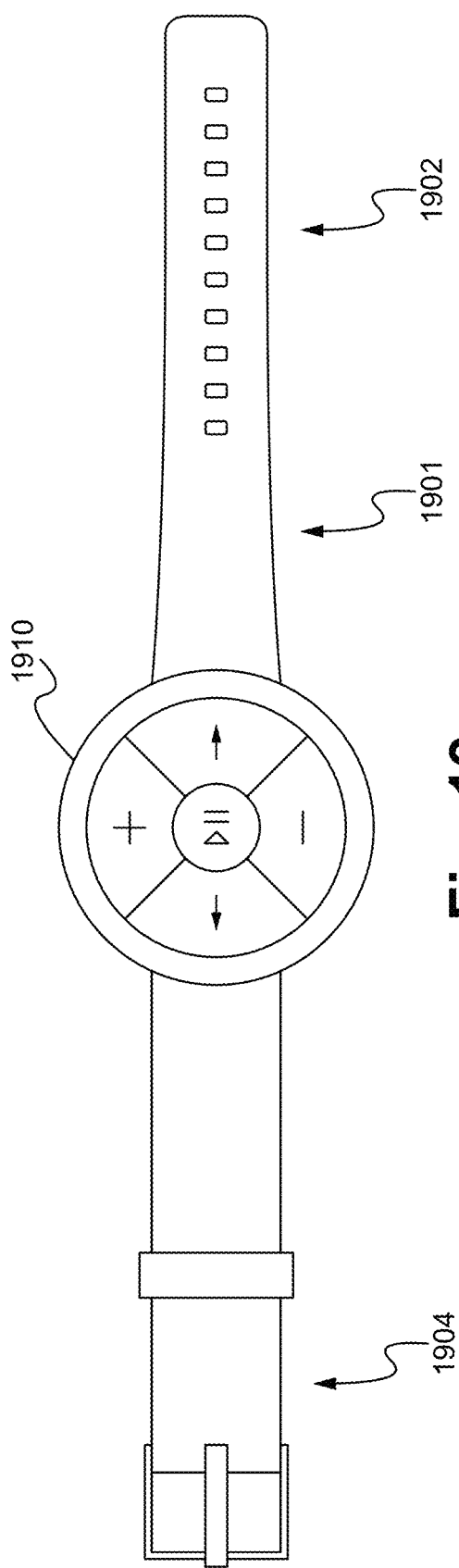
FIG. 19 illustrates a remote control device and system, in accordance with some embodiments.

As shown within FIG. 19, in further embodiments, the body 1901 comprises a fastenable band comprising a right side 1902 and a left side 1904. A user is able to fasten the right side 1902 to the left side 1904 at an appropriate size around the user's appendage. In some embodiments, the body 1901 comprises a cavity, such as described above so that the controller 1910 is able to removably couple to the body 1901.

Figure 20:
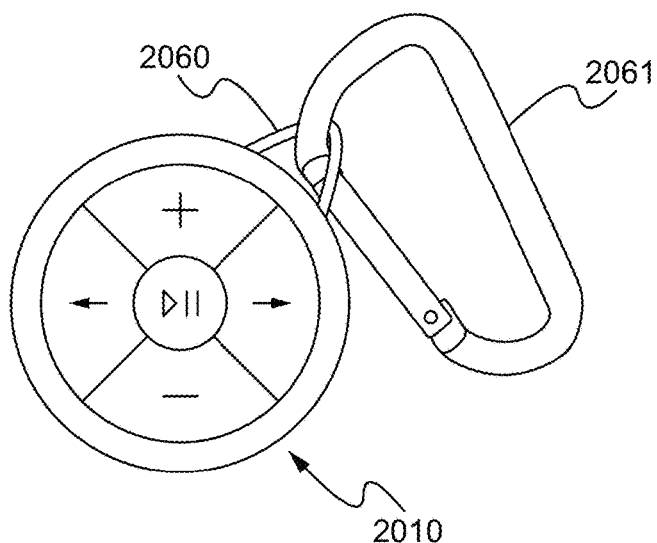
FIG. 20 illustrates a remote control device and system, in accordance with some embodiments.

In some embodiments, such as shown within FIG. 20, the controller 2010 is configured to couple with an attachment. For example, in some embodiments the controller 2010 comprises a loop 2060 or other mechanism which enables the body 2010 to couple with an attachment such as a carabineer 2061. Using the carabineer 2061, the controller 2010 is able to be attached to other objects and in a convenient place where it is able to be used to control an electronic device, such as described above. Particularly, the controller 2010 can be used with other appropriately desired attachment devices such as a lanyard, a key chain and other appropriately desired attachment devices.

Figure 21:
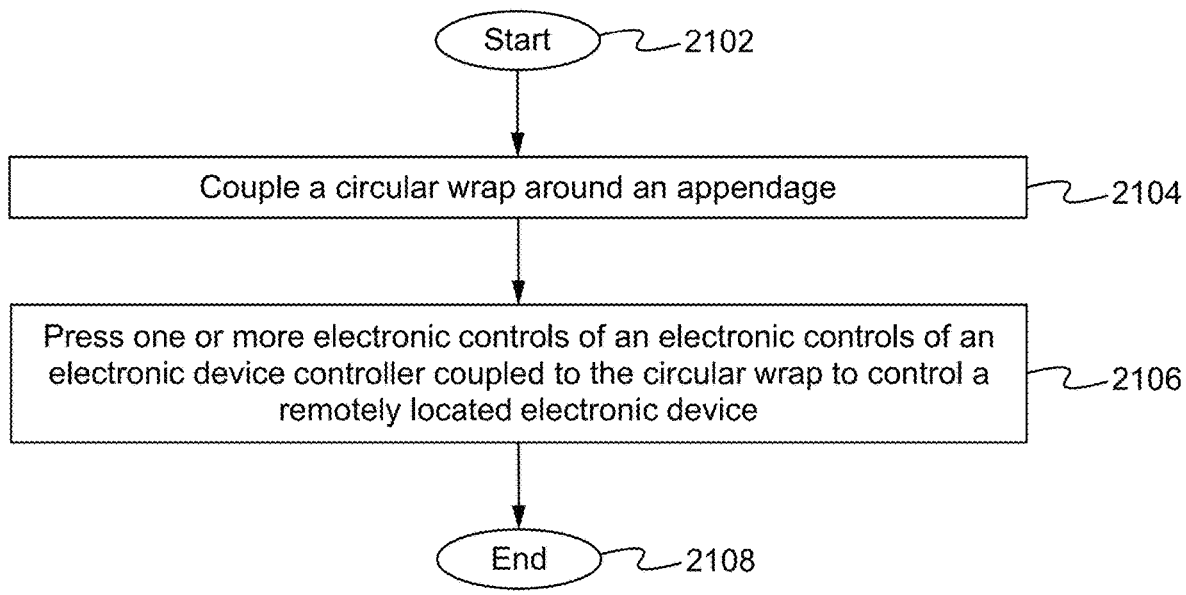
FIG. 21 illustrates a method of utilizing a remote control, in accordance with some embodiments.

FIG. 21 illustrates a method of utilizing a remote control in accordance to some embodiments. In some embodiments, the remote control comprises an electronic device controller, such as described above. The method begins in the step 2102. In the step 2104, a circular wrap is coupled with an appendage of a user such that the circular wrap continuously wraps around an entire circumference of the appendage of the user. Then, in the step 2106, one or more electronic controls of an electronic device controller coupled to the circular wrap are pressed to control a remotely located electronic device. The method ends at the step 2108.

Figure 22:
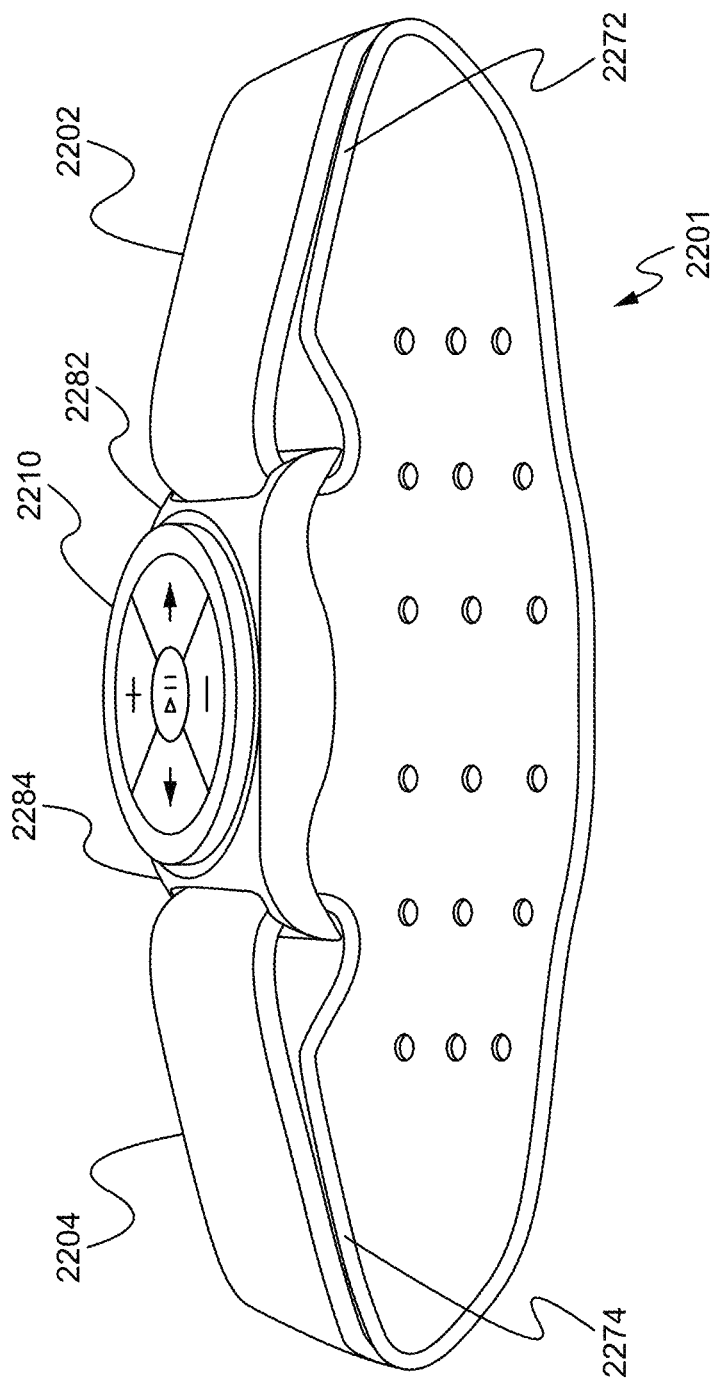
FIG. 22 illustrates a remote control device and system, in accordance with some embodiments.

As further shown within FIG. 22, in some embodiments, the body 2201 comprises a band comprising a right side 2202 and a left side 2204. A user is able to loop the right side 2202 through a lug 2282 of the controller 2210 to fasten the right side 2202 to a section 2272 of the right side 2202. In some embodiments, the right side 2202 is fastened to the section 2272 using hook and loop material or other appropriately desired fastening mechanism. Similarly, a user is able to loop the left side 2204 through a lug 2284 of the controller 2210 to fasten the left side 2204 to a section 2274 of the left side 2204. In some embodiments, the right side 2204 is fastened to the section 2274 using hook and loop material or other appropriately desired fastening mechanism. In some embodiments, the body 2201 comprises a cavity, such as described above so that the controller 2210 is able to removably couple to the body 2201.

Figure 23A:
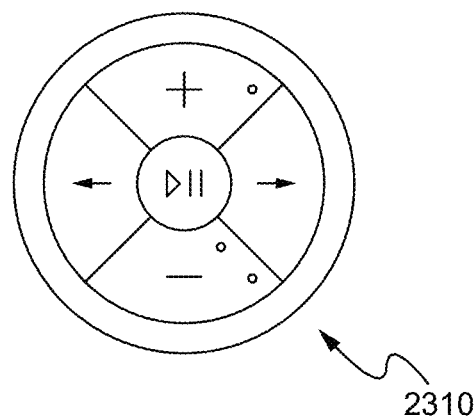
FIGS. 23A-23C illustrate an electronic device controller, in accordance with some embodiments.

FIG. 23A illustrate the controller, such as described above, in accordance with further embodiments. FIG. 23A illustrates a front sides of the electronic device controller 2310 comprising one or more controls for controlling a remotely located electronic device. As described above, the remote control is able to comprise any appropriately desired control buttons for controlling a remotely located electronic device. Additionally, the buttons are able to be placed within any appropriately desired location and/or orientation on the electronic device controller. In some embodiments, the electronic device controller comprises touch screen controls. As described above, the electronic device controller is configured to communicate with and/or control a remotely located electronic device, such as a smart phone, media player, personal video camera or other appropriately desired device. In some embodiments, such as shown within FIG. 23A, the controller 2310 is between 6.25 mm and 6.75 mm thick. However, the controller 2310 is able to comprise any appropriately desired dimensions.

Figure 23B:
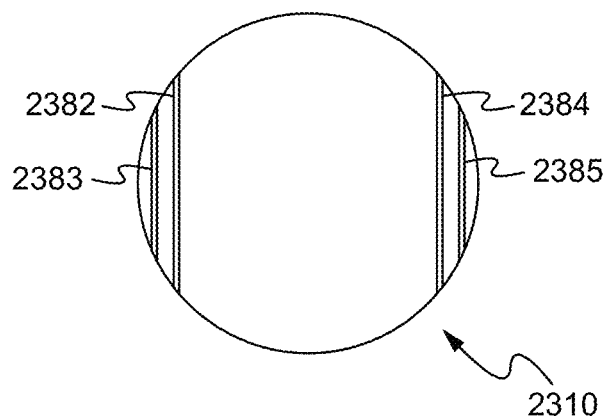

FIG. 23B illustrates a back side of the controller 2310 such as described above. In some embodiments, the lugs 2382 and 2383 and 2384 and 2385 are spaced 3 mm apart and configured to accept a strap and/or a body, such as described above that is 23 mm wide. In some embodiments, the strap and/or body, such as described above comprises hook and loop material.

Figure 23C:
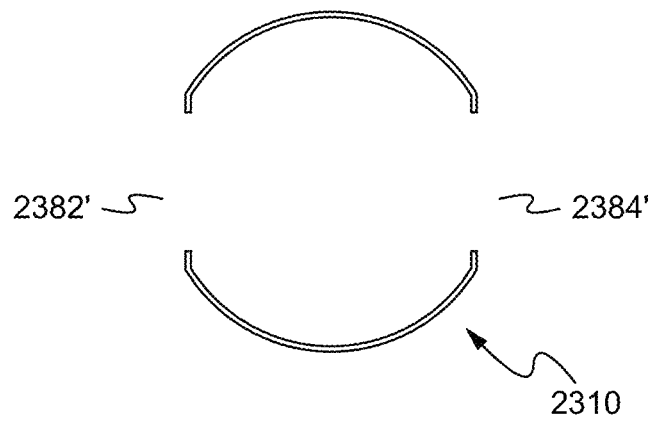

As shown in FIG. 23C, in some embodiments, a right lug 2382' and a left lug 2384' of the controller 2310 are configured to accept a fastenable band, such as described above. In some embodiments, a face of the controller is able to be up to 46 mm wide.

As described above, and as shown within FIG. 10, in some embodiments, a remote control device, such as described above is able to be used with headphones comprising EMF radiation shielding material such as NEMKO lab tested and certified EMF radiation shielding material for shielding EMF radiation generated by the headphones.

FIG. 24 illustrates an earbud, such as described above in accordance with further embodiments. The earbud 2450 comprises an earbud body 2452 comprising a rear body housing 2455 and an ear tip 2453 for inserting into an ear of a user when the earbud 2450 is being used and an electromagnetic shielding material 2451. The electromagnetic shielding material 2451 is coupled to the earbud body 2452 and deflects EMF radiation such as electric and electromagnetic radiation produced by the earbud 2450 away from a head and body of the user when the earbud 2450 is worn.

As shown within FIG. 24, the EMF radiation shielding material 2451 is coupled to the earphone or earbud 2450 on the outside of the earbud body 2452 and the same side as the ear tip 2453 opposite the rear body housing 2455. Consequently, when the earbud 2540 is placed in the user's ear, the EMF radiation shielding material deflects EMF radiation away from the head and body of the user. Additionally, the EMF shielding material 2451 does not wrap entirely around the earphone body 2452 so that the EMF shielding material 2451 deflects rather than traps the EMF radiation. As shown within FIG. 24, the EMF radiation shield 2451 is coupled to a stem 2454 of the earbud 2450. However, the EMF radiation shield 2451 is able to couple to any portion of the earbud 2450 where it is able to deflect EMF radiation away from the user.

In some embodiments, the EMF radiation shielding material 2451 couples to the earbud body 2452 using an adhesive backing material. However, the EMF radiation shielding material 2451 is able to couple to the earbud body using any appropriately desired method. For example, in some embodiments, the EMF radiation shielding material 2451 couples with the earbud body 2452 using a magnetic or hook and loop connection.

In some embodiments, the EMF radiation shielding material 2451 comprises a coating of silver, copper, or a combination thereof. In some embodiments, the EMF radiation shielding material 2451 comprises a silver or copper laminate. However, the EMF radiation shielding material 2451 is able to comprise any appropriately desired EMF radiation shielding material. For example, in some embodiments, the EMF radiation shielding material 2451 comprises comprises a plurality of embedded metal particles. In some embodiments, such as described above, the EMF radiation shielding material comprises NEMKO lab tested and certified EMF radiation shielding material.

In addition, the EMF radiation shielding material 2451 is of a thickness that enables an earbud to be placed within a charging case with the electromagnetic magnetic shielding material 2451 coupled to the earbud 2450.

As further shown within FIG. 24, the earbud 2450 is a wired earbud comprising a wire 2457 for wiredly coupling with an electronic device (not shown). However, as further described below, the earbud or earphone 2450 is able to comprise any appropriately desired earbud. For example, in some embodiments, the earbud comprises one of a wired earbud, a wireless earbud and a truly wireless earbud.

In further embodiments, such as shown within FIG. 25, the EMF radiation shielding material is incorporated within a sleeve that is fit onto the body of the earbud. As shown within FIG. 25, the earbud 2550 comprises an earbud body 2552 comprising a rear body housing 2555 and an ear tip 2553 for inserting into an ear of a user when the earbud 2550 is being used. As further shown within FIG. 25, a sleeve 2510 is fit around the body 2552 of the earbud 2550. The sleeve 2510 comprises a first section comprising EMF radiation shielding material 2551 and a second section 2511 that does not have the EMF radiation shielding material 2551. The sleeve 2510 is fit around the earbud body 2552 such that the first section comprising EMF radiation shielding material 2551 is on the inside of the earbud body 2552 the same side as the ear tip 2553 opposite the rear body housing 2555. Consequently, when the earbud 2540 is placed in the user's ear, the EMF radiation shielding material deflects EMF radiation away from the head and body of the user. As stated above, the second section 2511 of the sleeve 2510 that does not have the EMF radiation shielding material 2551 is on an outside or the same side as the rear body housing 2555 so that the EMF shielding material 2551 deflects rather than traps the EMF radiation. As shown within FIG. 25, the sleeve 2510 is coupled to a stem 2554 of the earbud 2550. However, the EMF radiation shield 2551 is able to couple to any portion of the earbud 2550 where it is able to deflect EMF radiation away from the user.

In some embodiments, the EMF radiation shielding material 2551 of the sleeve 2510 comprises silver, copper, or a combination thereof. In some embodiments, the EMF radiation shielding material 2551 comprises a silver or copper laminate. However, the EMF radiation shielding material 2551 is able to comprise any appropriately desired EMF radiation shielding material. For example, in some embodiments, the EMF radiation shielding material 2551 comprises a plurality of embedded metal particles. In some embodiments, such as described above, the EMF radiation shielding material comprises NEMKO lab tested and certified EMF radiation shielding material. In addition, the EMF radiation shielding material 2551 is of a thickness that enables an earbud to be placed within a charging case with the electromagnetic magnetic shielding material 2551 coupled to the earbud 2550.

As further shown within FIG. 25, the earbud 2550 is a truly wireless earbud and does not comprise an external wires. The earbud 2550 communicates with an audio source such as an electronic device is a wirelessly. As further described above and below, the earbud or earphone 2550 is able to comprise any appropriately desired earbud. For example, in some embodiments, the earbud comprises one of a wired earbud, a wireless earbud and truly wireless earbud.

FIG. 26 illustrates a set of earphones 2600 in accordance with some embodiments. As will be understood by someone of ordinary skill in the art, the earbud 2450 and the earbud 2550 are also able to be used within a set of earphones. As shown within FIG. 26, the earbud 2650 comprises an earbud body 2652 comprising a rear body housing 2655 and an ear tip 2653 for inserting into an ear of a user when the earbud 2650 is being used and the earbud 2650' comprises an earbud body 2652' comprising a rear body housing 2655' and an ear tip 2653' for inserting into an ear of a user when the earbud 2650' is being used.

As shown within FIG. 26, the EMF radiation shielding material 2651 is coupled to an interior of the earphone or earbud body 2652 on the same side as the ear tip 2653 opposite the rear body housing 2655 and the EMF radiation shielding material 2651' is coupled to an interior of the earphone or earbud body 2652' on the same side as the ear tip 2653' opposite the rear body housing 2655'. Consequently, as described above, when the earbuds are placed in the user's ear, the EMF radiation shielding material deflects EMF radiation away from the head and body of the user. As shown within FIG. 26, the EMF radiation shield 2651 is coupled to an interior of the stem 2654 of the earbud 2650 and the EMF radiation shield 2651' is coupled to an interior of the stem 2654' of the earbud 2650'. However, as described above, the EMF radiation shield 2651 is able to couple to any portion of the earbud 2650 and the radiation shield 2651' is able to couple to any portion of the earbud 2650' where they are able to deflect EMF radiation away from the user. In further embodiments, the EMF radiation shielding material 2651 is baked and/or incoporated within the material of the earbud 2650 and the radiation shield 2651' is baked and/or incoporated within the material of the earbud 2650'.

In some embodiments, the EMF radiation shielding material 2651 and 2651' comprises a coating of silver, copper, or a combination thereof. In some embodiments, the EMF radiation shielding material 2651 and 2651 comprises a silver or copper laminate. However, the EMF radiation shielding material 2651 and 2651' is able to comprise any appropriately desired EMF radiation shielding material. For example, in some embodiments, the EMF radiation shielding material 2651 comprises a plurality of embedded metal particles. In some embodiments, such as described above, the EMF radiation shielding material comprises NEMKO lab tested and certified EMF radiation shielding material. In addition, the EMF radiation shielding material 2651 and 2651' is of a thickness that enables an earbud to be placed within a charging case with the electromagnetic magnetic shielding material 2651 and 2651' coupled to the earbud 2650.

As further shown within FIG. 26, the set of earphones 2600 are wireless earbuds connected by a wire 2657 that enable the earbud and the earbud to be hung around a neck or other object when not being used by a user. The set of earphones 2600 communicates with an audio source such as an electronic device wirelessly. As described above, the set of earphones 2600 are able to comprise any appropriately desired earbuds. For example, in some embodiments, the earbuds comprises one of a wired earbuds, wireless earbuds and truly wireless earbuds.

Figure 27:
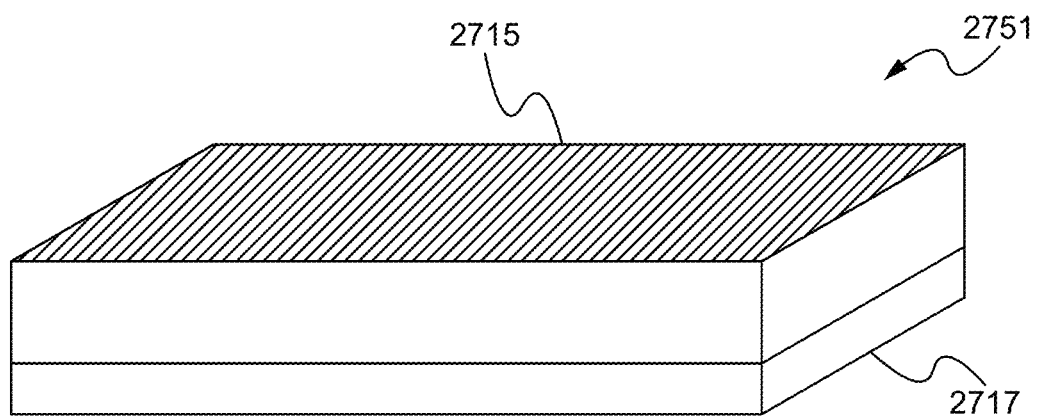
FIG. 27 illustrates an electromagnetic shielding material for deflecting electro and electromagnetic radiation, in accordance with some embodiments.

FIG. 27 illustrates an EMF radiation shielding material 2751 such as described above. As shown within FIG. 27, the EMF radiation shielding material 2751 comprises an EMF radiation shielding coating 2715 and a backing 2717 for coupling the EMF radiation shielding material 2751 with an earbud, such as described above. In some embodiments, the coating 2715 comprises silver, copper, or a combination thereof. In some embodiments, the coating 2715 comprises a silver or copper laminate. However, as described above, the coating 2715 is able to comprise any appropriately desired EMF radiation shielding material. For example, in some embodiments, the coating 2715 comprises a plurality of embedded metal particles. In some embodiments, such as described above, the coating comprises NEMKO lab tested and certified EMF radiation shielding material. In addition, the EMF radiation shielding material 2751 is of a thickness that enables an earbud to be placed within a charging case with the electromagnetic magnetic shielding material 2715 coupled to the earbud.

As further described above, in some embodiments, the backing 2717 comprises an adhesive backing material. However, the backing 2717 is able to comprise any appropriately desired mechanism for coupling the radiation shielding material 2751 to an earphone. For example, the backing enables the EMF radiation shielding material 2751 to couple with an earbud body using a magnetic or hook and loop connection.

Figure 28:
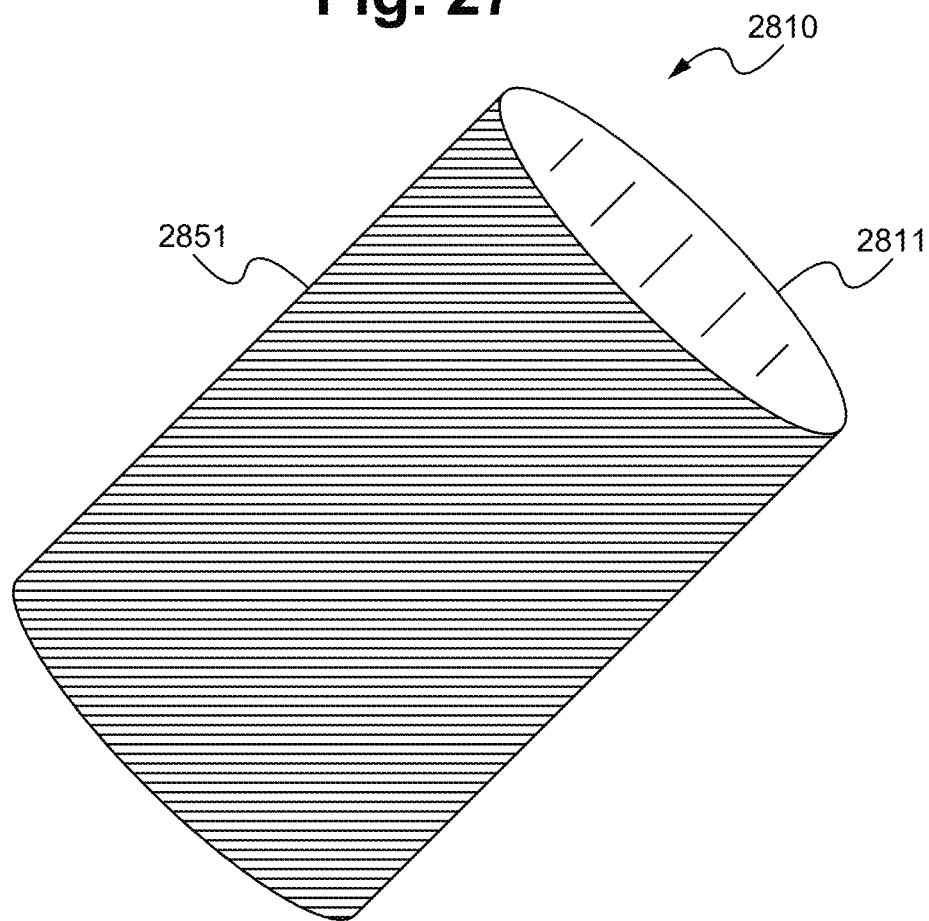
FIG. 28 illustrates a sleeve comprising an electromagnetic shielding material for deflecting electro and electromagnetic radiation that is configured to fit around a body of an earbud, in accordance with some embodiments.

FIG. 28 illustrates a sleeve 2810 that is configured to fit around a body of an earbud, such as described above. As described above, the sleeve 2810 comprises a first section comprising EMF radiation shielding material 2851 and a second section 2811 that does not have the EMF radiation shielding material 2851. The sleeve 2810 is fit around an earbud body such that the first section comprising EMF radiation shielding material 2851 is on the inside of the earbud body and the same side as the ear tip opposite the rear body housing. Consequently, when the earbud is placed in the user's ear, the EMF radiation shielding material 2851 deflects EMF radiation away from the head and body of the user.

As described above, in some embodiments, the shielding material 2851 comprises silver, copper, or a combination thereof. In some embodiments, the shielding material 2851 comprises a silver or copper laminate. However, as described above, the shielding material 2851 is able to comprise any appropriately desired EMF radiation shielding material. For example, in some embodiments, the shielding material 2851 comprises a plurality of embedded metal particles. In some embodiments, such as described above, the EMF radiation shielding material comprises NEMKO lab tested and certified EMF radiation shielding material. In addition, the EMF radiation shielding material 2851 is of a thickness that enables an earbud to be placed within a charging case with the sleeve 2810 coupled to the earbud.

Figure 29:
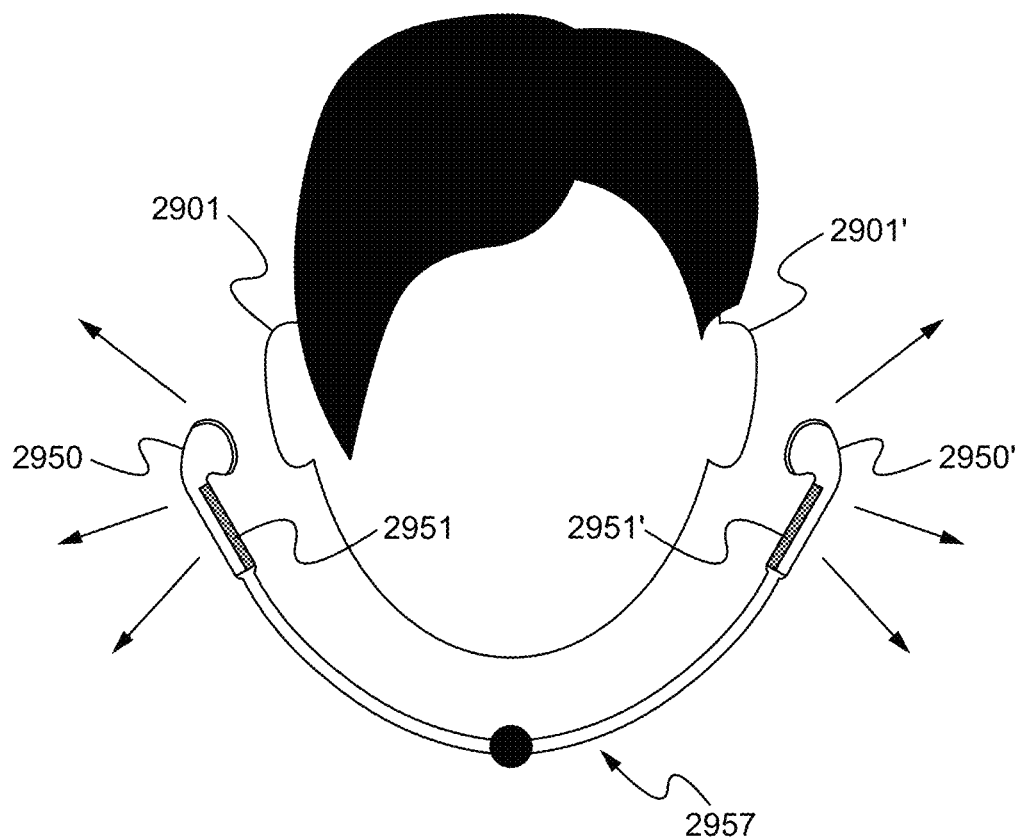
FIGS. 29 and 30 illustrate a set of earphones being placed within the ears of a user, in accordance with some embodiments.
Figure 30:
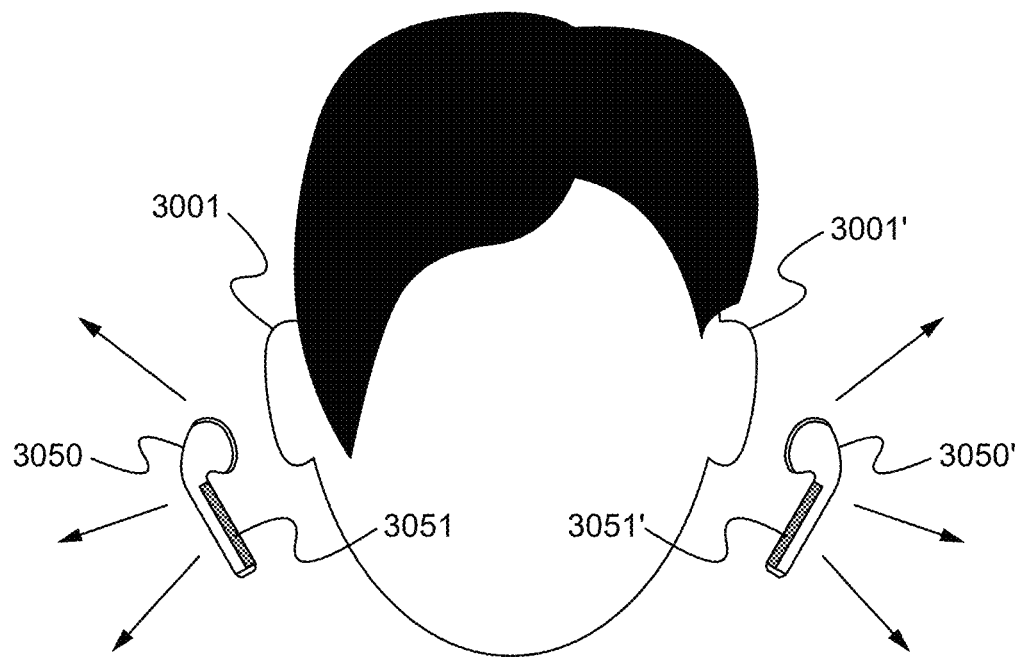

FIGS. 29 and 30 illustrate a set of earphones being placed within the ears of a user in accordance with some embodiments. As shown within FIG. 29, when the earbud 2950 is placed within the ear of a user 2901 the radiation shielding material 2951 deflects EMF radiation away from a head and body of the user as indicated by the arrows and when the earbud 2950' is placed within the ear of a user 2901' the radiation shielding material 2951' deflects EMF radiation away from a head and body of the user as indicated by the arrows. As shown within FIG. 29, the set of earphones comprising wireless earphones that are connected by a cord 2957 or wire for hanging the earphones when not being used. As shown within FIG. 30, when the earbud 3050 is placed within the ear of a user the radiation shielding material 3051 deflects EMF radiation away from a head 3001 and body of the user as indicated by the arrows and when the earbud 3050' is placed within the ear of a user 3001' the radiation shielding material 3051' deflects EMF radiation away from a head and body of the user as indicated by the arrows. As shown within FIG. 30, the set of earphones comprises truly wireless earphones. As described above, the set of earphones incorporating an EMF radiation shielding material is able to comprise any appropriately desired set of earphones.

Figure 31:
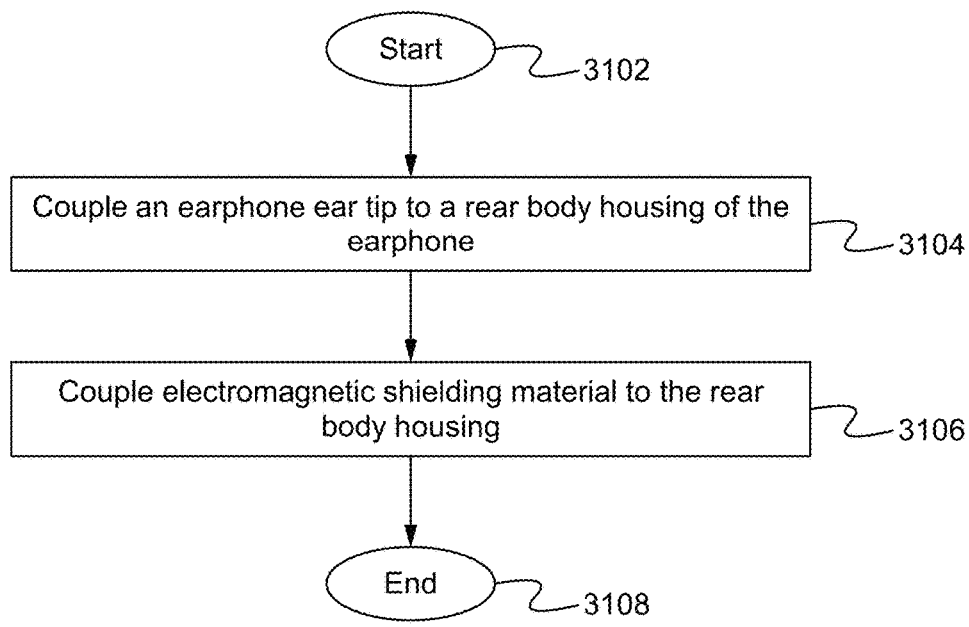
FIG. 31 illustrates a method of manufacturing an earbud, in accordance with some embodiments.

FIG. 31 illustrates a method of manufacturing an earbud in accordance with some embodiments. The method begins in the step 3102. In the step 3104, an earphone ear tip for inserting into an ear of a user is coupled to a rear body housing of the earbud. In the step 3106, an electromagnetic shielding material is coupled to the rear body housing. The electromagnetic shielding material deflects electromagnetic radiation away from a head and a body of a user when the earbud is worn by the user. In some embodiments, the electromagnetic shielding material is coupled to the body housing using an adhesive backing. In some of these embodiments, the electromagnetic shielding material is coupled to a stem of the earbud body. In some embodiments, the electromagnetic shielding material comprises a wrap that is slipped onto the earbud body. In some embodiments, the electromagnetic shielding material is coupled within an interior of the earbud housing. In further embodiments, the EMF radiation shielding material is baked and/or incoporated within the material of the earbud housing. The method ends in the step 3108.

As described above, in some embodiments, the shielding material comprises silver, copper, or a combination thereof. In some embodiments, the shielding material comprises a silver or copper laminate. However, as described above, the shielding material is able to comprise any appropriately desired EMF radiation shielding material. For example, in some embodiments, the EMF the shielding material comprises a plurality of embedded metal particles. In some embodiments, such as described above, the EMF radiation shielding material comprises NEMKO lab tested and certified EMF radiation shielding material. In addition, the EMF radiation shielding material is of a thickness that enables an earbud to be placed within a charging case with the electromagnetic magnetic shielding material coupled to the earbud.

Figure 32:
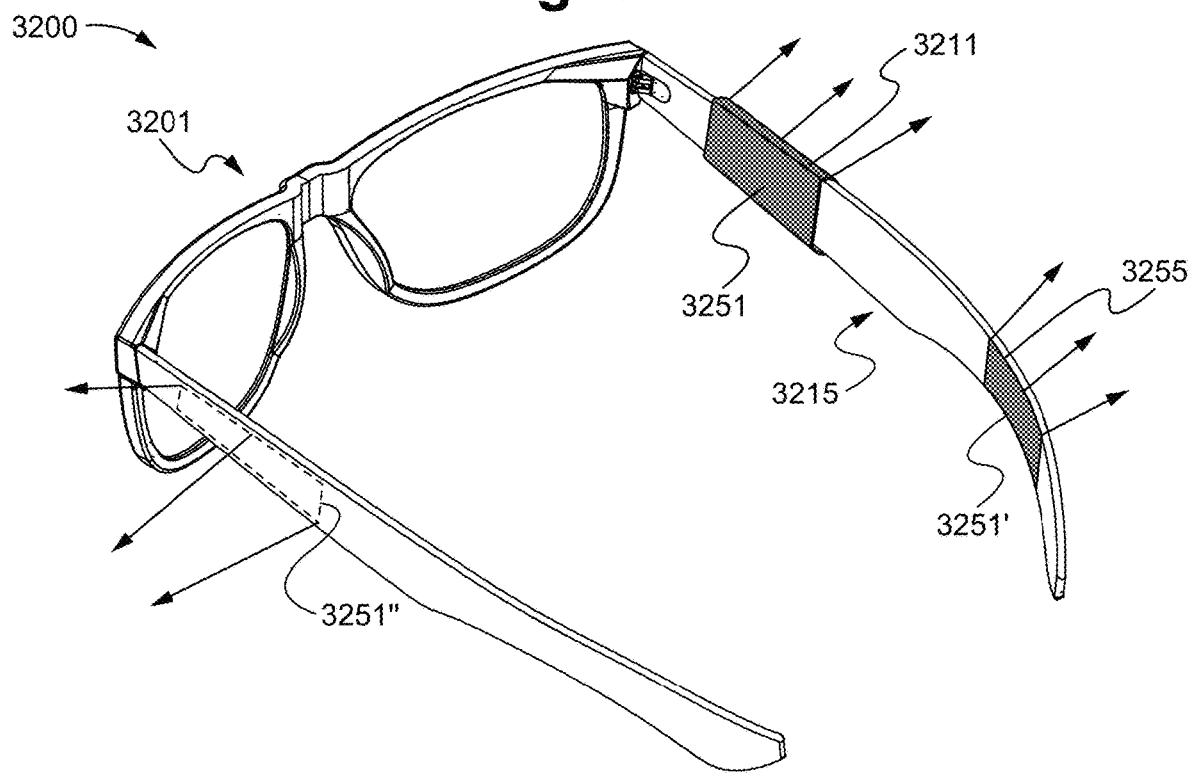
FIG. 32 illustrates an electronic device, in accordance with some embodiments.

Referring now to FIG. 32, an electronic device 3200 is depicted therein. The electronic device 3200 comprises a device body 3201. In some embodiments, the electronic device 3200 emits EMF radiation, such as described above. In some embodiments, the body 3201 comprises one or more points of EMF radiation such as an antenna or other electronic component built into the body 3201. As shown within FIG. 32, an EMF shielding material is able to couple to the body 3201 such that it covers the one or more points of EMF radiation to deflect the EMF radiation outward and away from the device body 3201. Particularly, as shown within FIG. 32, the EMF shielding material is coupled to a pair of smart glasses. However, the EMF shielding material is able to couple to any appropriately desired electronic device and for shielding EMF radiation.

In some embodiments, the EMF shielding material comprises a sleeve that is fit onto the device body 3201, such as described above. For example, as shown within FIG. 32, a sleeve 3210 is fit around the body 3201 of the electronic device 3200. The sleeve 3210 comprises a first section comprising EMF radiation shielding material 3251 and a second section 3211 that does not have the EMF radiation shielding material 3251. The sleeve 3210 is fit around a temple 3215 such that the first section comprising EMF radiation shielding material 3251 is on an inside of the body 3201. Consequently, the EMF shielding 3251 material deflects EMF radiation away from the body 3201 and away from a user, when the electronic device 3200 is in use. As stated above, the second section 3211 of the sleeve 3210 that does not have the EMF radiation shielding material 3251 is on an outside so that the EMF shielding material 3251 deflects rather than traps the EMF radiation. As shown within FIG. 32, the sleeve 3210 is coupled to a temple 3211 of the electronic device 3200. However, the EMF radiation shield 3251 is able to couple to any portion of the body 3201 where it is able to deflect EMF radiation away from the user.

In further embodiments, an EMF radiation shielding material 3251' couples to the body 3201 using an adhesive backing material, such as described above. However, the EMF radiation shielding material 3251' is able to couple to an electronic device 3200 using any appropriately desired method. For example, in some embodiments, the EMF radiation shielding material 3251' couples with the device body 3201 using a magnetic or hook and loop connection. The electromagnetic shielding material 3251' is coupled to the body 3201 and deflects EMF radiation such as electric and electromagnetic radiation produced by the electronic device 3200 away from a user.

In further embodiments, such as shown within FIG. 32, the EMF radiation shielding material 3251" is coupled to an interior of the body 3201 wherein it able to deflect the EMF radiation away from the electronic device 3200 and a way from a user as the electronic device 3200 is used. Particularly, the EMF radiation shielding material 3251" us able to be placed at an inside of the body 3201 to deflect the EMF radiation from one or more antennas of the electronic device 3200. In some embodiments, the EMF radiation shielding material 3251" is able to be baked and/or incoporated within the material of the body 3201 to deflect the EMF radiation outward and away from the device body 3201.

In some embodiments, the EMF radiation shielding material 3251, 3251' and 3251" comprises silver, copper, or a combination thereof. In some embodiments, the EMF radiation shielding material 3251, 3251' and 3251" comprises a silver or copper laminate. However, the EMF radiation shielding material 3251, 3251' and 3251" is able to comprise any appropriately desired EMF radiation shielding material. For example, in some embodiments, the EMF radiation shielding material 3251, 3251' and 3251" comprises a plurality of embedded metal particles. In some embodiments, such as described above, the EMF radiation shielding material 3251, 3251' and 3251" comprises NEMKO lab tested and certified EMF radiation shielding material. In addition, the EMF radiation shielding material 3251, 3251' and 3251" is of a thickness that enables the electronic device 3200 with the electromagnetic magnetic shielding material 3251, 3251' and 3251" to be easily stored.

Figure 33:
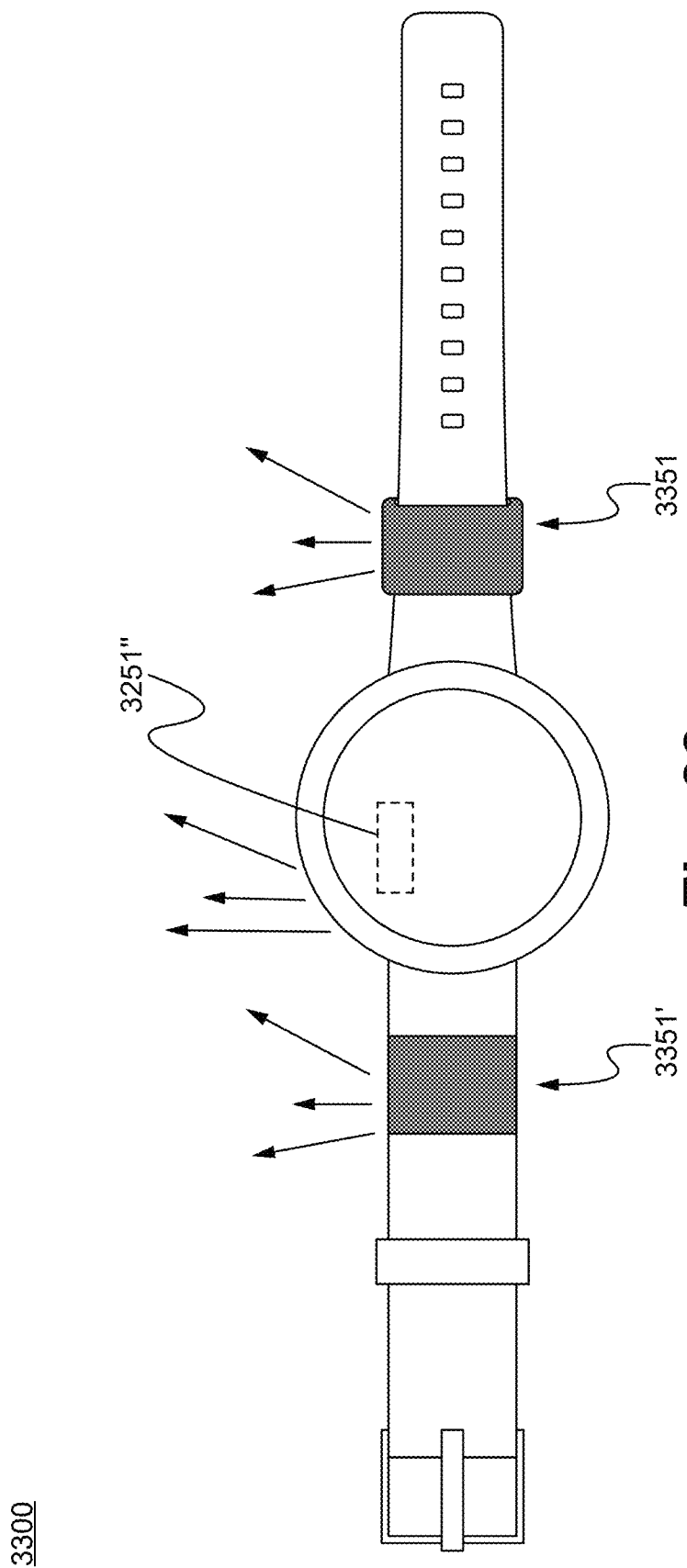
FIG. 33 illustrates an electronic device, in accordance with some embodiments.

FIG. 33 illustrates an electronic device 3200 in accordance with some embodiments. The electronic device 3300 comprises a device body 3201. As shown within FIG. 33, the device body 3301 is configured to be worn by a user. For example, in some embodiments, the electronic device 3300 comprises a watch, a bracelet or a fitness tracker that is configured to be worn on an arm or a wrist of a user. However, the electronic device 3300 is able to comprise any appropriately desired electronic device. For example, in some embodiments, the electronic device 3300 comprises a pair of glasses, such as described above, a bracelet and a necklace.

In some embodiments, the electronic device 3300 emits EMF radiation, such as described above. In some embodiments, the body 3301 comprises one or more points of EMF radiation such as an antenna or other electronic component built into the body 3301. As shown within FIG. 33, an EMF shielding material is able to couple to the body 3301 such that it covers the one or more points of EMF radiation to deflect the EMF radiation outward and away from the device body 3301. Particularly, as shown within FIG. 33, the EMF shielding material is coupled to a watch. However, the EMF shielding material is able to couple to any appropriately desired electronic device and for shielding EMF radiation.

In some embodiments, the EMF shielding material comprises a sleeve that is fit onto the device body 3301, such as described above. For example, as shown within FIG. 33, a sleeve 3310 is fit around the body 3301 of the electronic device 3300. The sleeve 3310 comprises a first section comprising EMF radiation shielding material 3351 and a second section 3311 that does not have the EMF radiation shielding material 3351. Consequently, the EMF shielding 3351 material deflects EMF radiation away from the body 3301 and away from a user, when the electronic device 3300 is in use. As stated above, the second section 3311 of the sleeve 3310 that does not have the EMF radiation shielding material 3351 is on an outside so that the EMF shielding material 3351 deflects rather than traps the EMF radiation. The EMF radiation shield 3351 is able to couple to any portion of the body 3301 where it is able to deflect EMF radiation away from the user.

In further embodiments, an EMF radiation shielding material 3351' couples to the body 3301 using an adhesive backing material, such as described above. However, the EMF radiation shielding material 3351' is able to couple to an electronic device 3300 using any appropriately desired method. For example, in some embodiments, the EMF radiation shielding material 3351' couples with the device body 3301 using a magnetic or hook and loop connection. The electromagnetic shielding material 3351' is coupled to the body 3301 and deflects EMF radiation such as electric and electromagnetic radiation produced by the electronic device 3300 away from a user.

In further embodiments, such as shown within FIG. 33, the EMF radiation shielding material 3351" is coupled to an interior of the body 3301 wherein it able to deflect the EMF radiation away from the electronic device 3300 and a way from a user as the electronic device 3300 is used. Particularly, the EMF radiation shielding material 3351" us able to be placed at an inside of the body 3301 to deflect the EMF radiation from one or more antennas of the electronic device 3300. In some embodiments, the EMF radiation shielding material 3351" is able to be baked and/or incoporated within the material of the body 3301 to deflect the EMF radiation outward and away from the device body 3301.

In some embodiments, the EMF radiation shielding material 3351, 3351' and 3351" comprises silver, copper, or a combination thereof. In some embodiments, the EMF radiation shielding material 3351, 3351' and 3351" comprises a silver or copper laminate. However, the EMF radiation shielding material 3351, 3351' and 3351" is able to comprise any appropriately desired EMF radiation shielding material. For example, in some embodiments, the EMF radiation shielding material 3351, 3351' and 3351" comprises a plurality of embedded metal particles. In some embodiments, such as described above, the EMF radiation shielding material 3351, 3351' and 3351" comprises NEMKO lab tested and certified EMF radiation shielding material. In addition, the EMF radiation shielding material 3351, 3351' and 3351" is of a thickness that enables the electronic device 3300 with the electromagnetic magnetic shielding material 3351, 3351' and 3351" to be easily stored.

Figure 34:
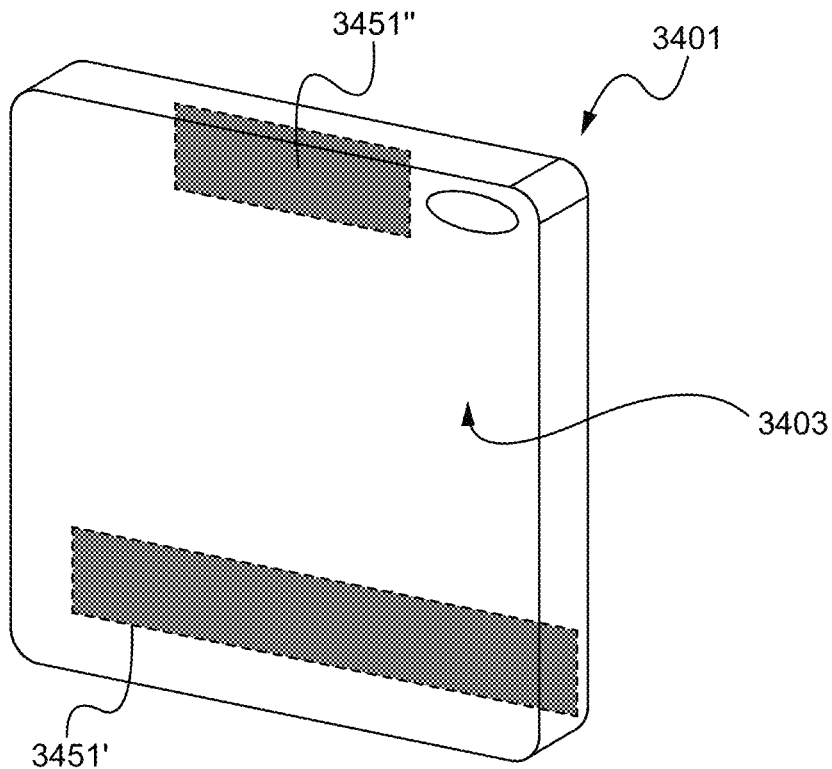
FIGS. 34 and 35 illustrate a cover for an electronic device, in accordance with some embodiments.

FIG. 34 illustrates a cover 3400 for an electronic device in accordance with some embodiments. The cover 3400 comprises a cover body 3401 and a cavity 3403 for removably receiving an electronic device. In some embodiments, the cavity 3403 is configured to receive a smart phone or a tablet. However, the cavity 3403 is able to receive any appropriately desired electronic device.

As shown within FIG. 34, the body 3401 comprises an electromagnetic shielding material coupled to the cover body 3401, wherein the electromagnetic shielding material is configured to deflect electromagnetic radiation away from the electronic device when it is removably received within the cavity 3403 of the body 3401.

In some embodiments, an EMF radiation shielding material 3451' couples to the body 3401 using an adhesive backing material, such as described above. However, the EMF radiation shielding material 3451' is able to couple to an electronic device 3400 using any appropriately desired method. For example, in some embodiments, the EMF radiation shielding material 3451' couples with the device body 3401 using a magnetic or hook and loop connection. The electromagnetic shielding material 3451' is coupled to the body 3401 and deflects EMF radiation such as electric and electromagnetic radiation produced by an electronic device received by the cover 3400. In some embodiments the EMF radiation shielding material 3451' is coupled to the electronic device before the cover 3400 is placed on the electronic device.

In further embodiments, the EMF radiation shielding material 3451" is able to be baked and/or incoporated within the material of the body 3401 to deflect the EMF radiation outward and away from the body 3401. For example, in some embodiments, the EMF radiation shielding material 3451" is incorporated within the rubber, silicone or plastic of the cover 3400.

Figure 35:
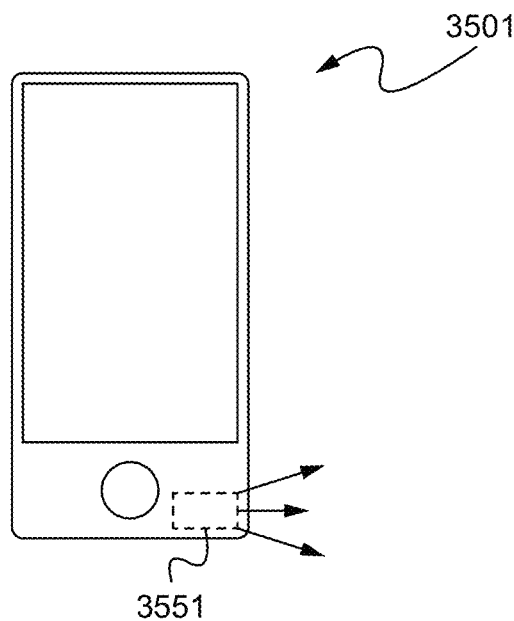

As shown within FIG. 35, in some embodiments, a cover body 3501 comprising EMF radiation shielding material 3551 is able to be installed on an electronic device 3500 during original manufacture of the electronic device 3500. In this manner, the EMF radiation shielding material 3551 deflects the EMF radiation outward and away from the electronic device 3500 when the electronic device 3500 is being used.

In some embodiments, the EMF radiation shielding material 3551, 3451' and 3451" comprises silver, copper, or a combination thereof. In some embodiments, the EMF radiation shielding material 3551, 3451' and 3451" comprises a silver or copper laminate. However, the EMF radiation shielding material 3551, 3451' and 3451" is able to comprise any appropriately desired EMF radiation shielding material. For example, in some embodiments, the EMF radiation shielding material 3551, 3451' and 3451" comprises comprises a plurality of embedded metal particles. In some embodiments, such as described above, the EMF radiation shielding material 3551, 3451' and 3451" comprises NEMKO lab tested and certified EMF radiation shielding material.

FIGS. 36A-36E illustrate an electronic device incorporating an EMF radiation shielding material in accordance with yet further embodiments. FIGS. 36A-36E illustrate a baby monitor incorporated within a sock for a baby. As shown within FIG. 36A, the sock device comprises an electronic monitor 3601 comprising an EMF shielding material 3651 that is coupled to a back of the electronic monitor 3601. As described above, the EMF shielding material 3651 is able to couple to an exterior of the monitor 3601 such that it covers on or more points of EMF radiation emitted by the monitor 3601 to deflect the radiation outward and away from the sock device 3600. As described above, the EMF shielding material 3651 is able to cover one or more points of EMF radiation such as an antenna or other electronic component built into the monitor 3601. Particularly, the EMF shielding material 3651 is able to couple to any appropriately desired position of the sock device 3600 and the electronic monitor 3601 for shielding EMF radiation.

Figure 36A:
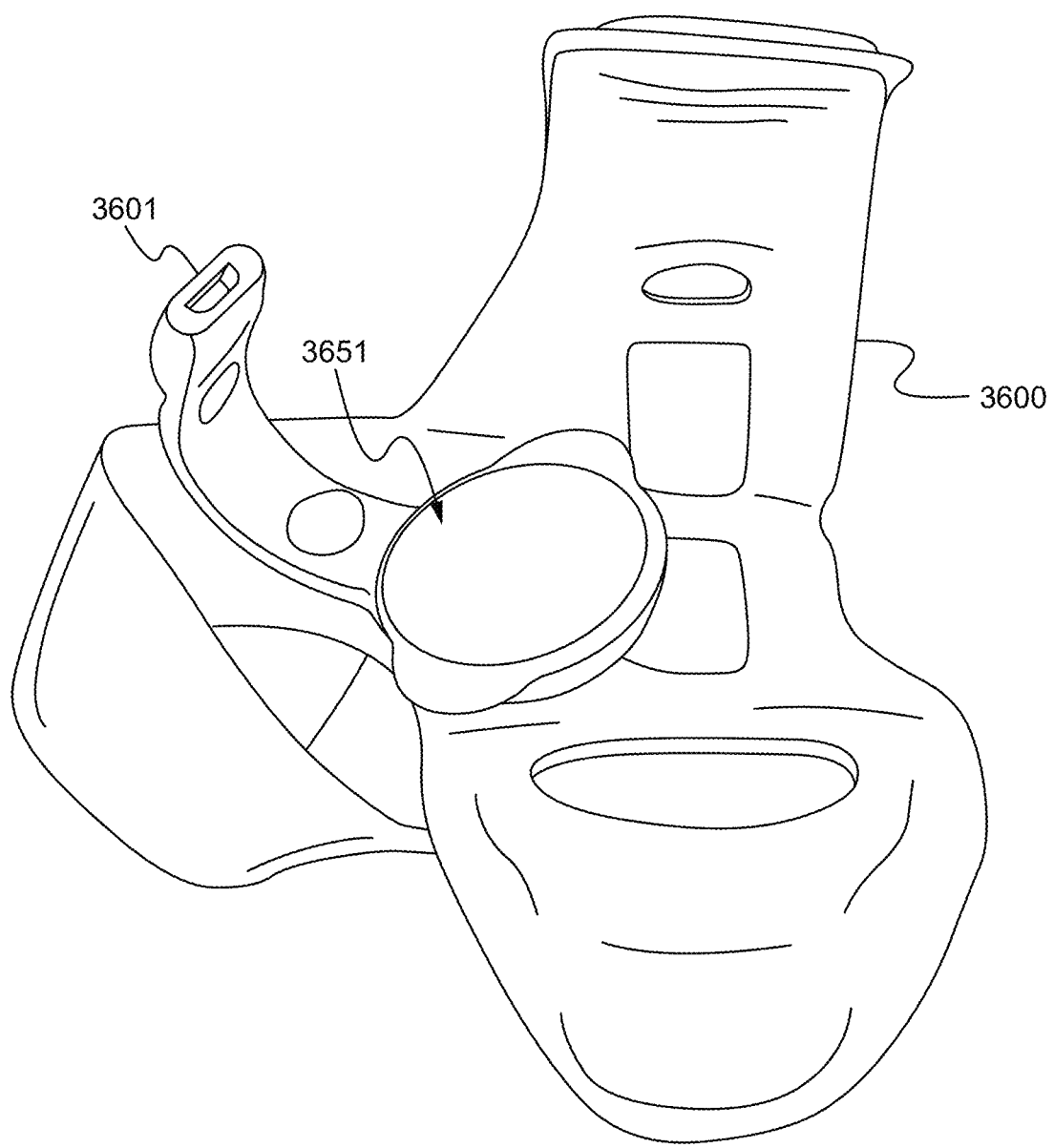
FIGS. 36A-36E illustrate an electronic device incorporating an EMF radiation shielding material, in accordance with further embodiments.
Figure 36B:
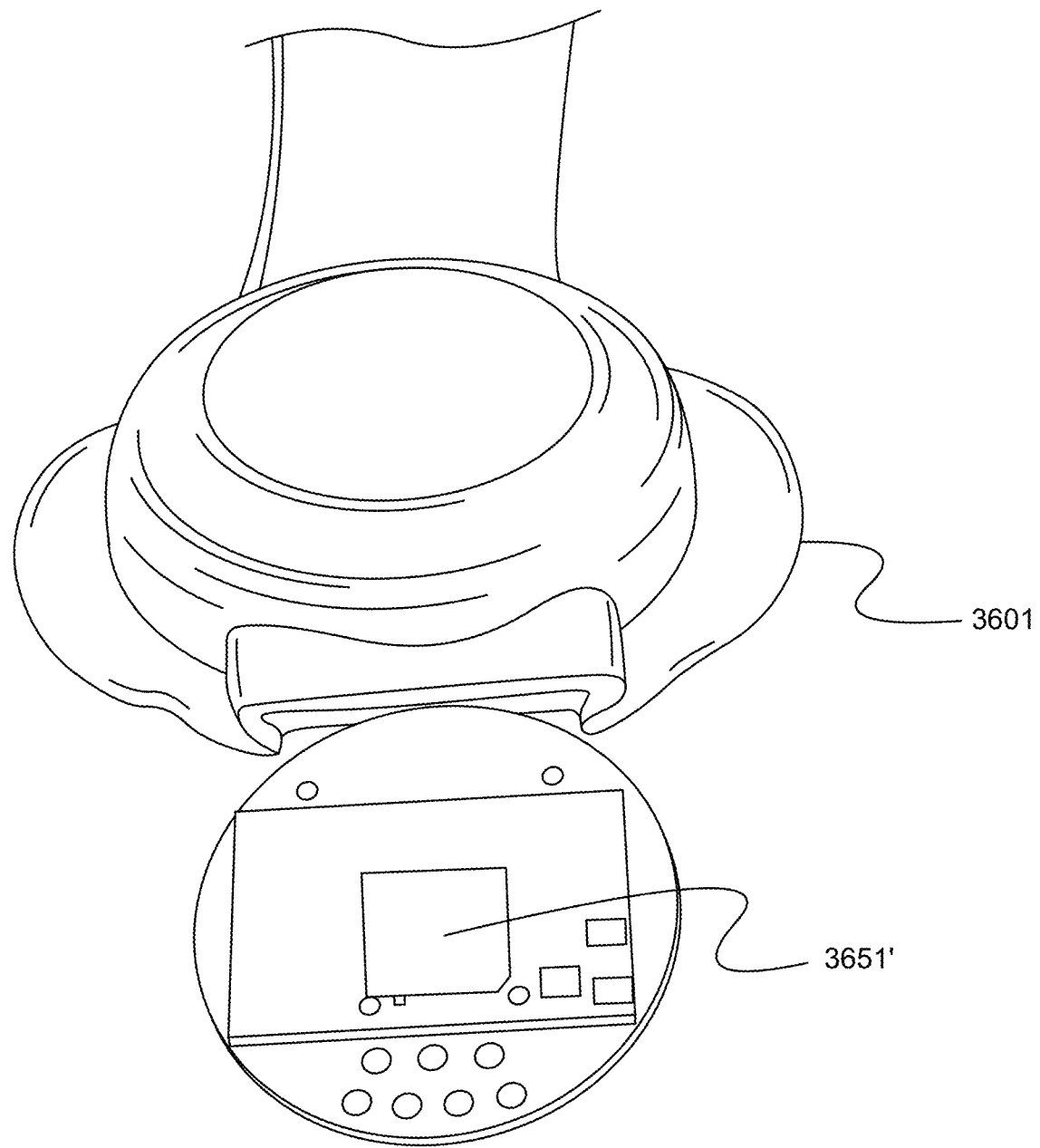

For example, such as shown within FIG. 36B, in some embodiments, an EMF shielding material 3651' is incorporated within an interior of the electronic monitor 3601 to shield the EMF radiation emitted by the monitor 3601. In some embodiments, the EMF radiation shielding material 3651' is able to be baked and/or incoporated within the material of the electronic monitor 3601 to deflect the EMF radiation outward and away from the sock device 3600.

Figure 36C:
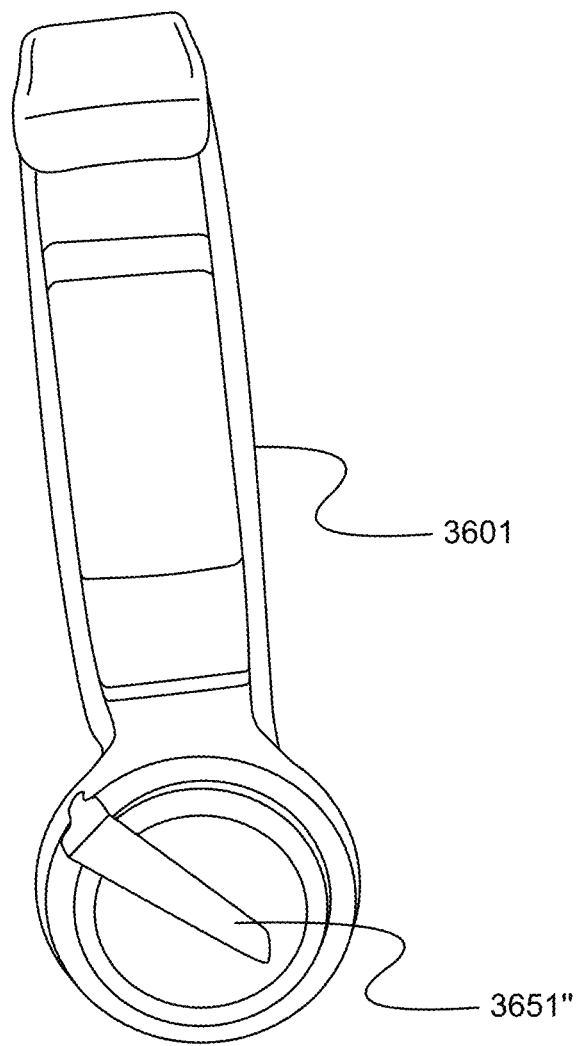

Alternatively, or in conjunction, as shown within FIG. 36C, in some embodiments, an EMF shielding material 3651" is adhesively attached to the monitor 3601, such as described above, to shield and reflect the EMF radiation produced by the monitor. However, the EMF radiation shielding material 3651" is able to couple to an electronic device 3200 using any appropriately desired method. For example, in some embodiments, the EMF radiation shielding material 3651" couples with the monitor 3601 using a magnetic or hook and loop connection. The electromagnetic shielding material 3651" is coupled to the monitor 3601 and deflects EMF radiation such as electric and electromagnetic radiation produced by the sock device 3600 away from a user.

Figure 36D:
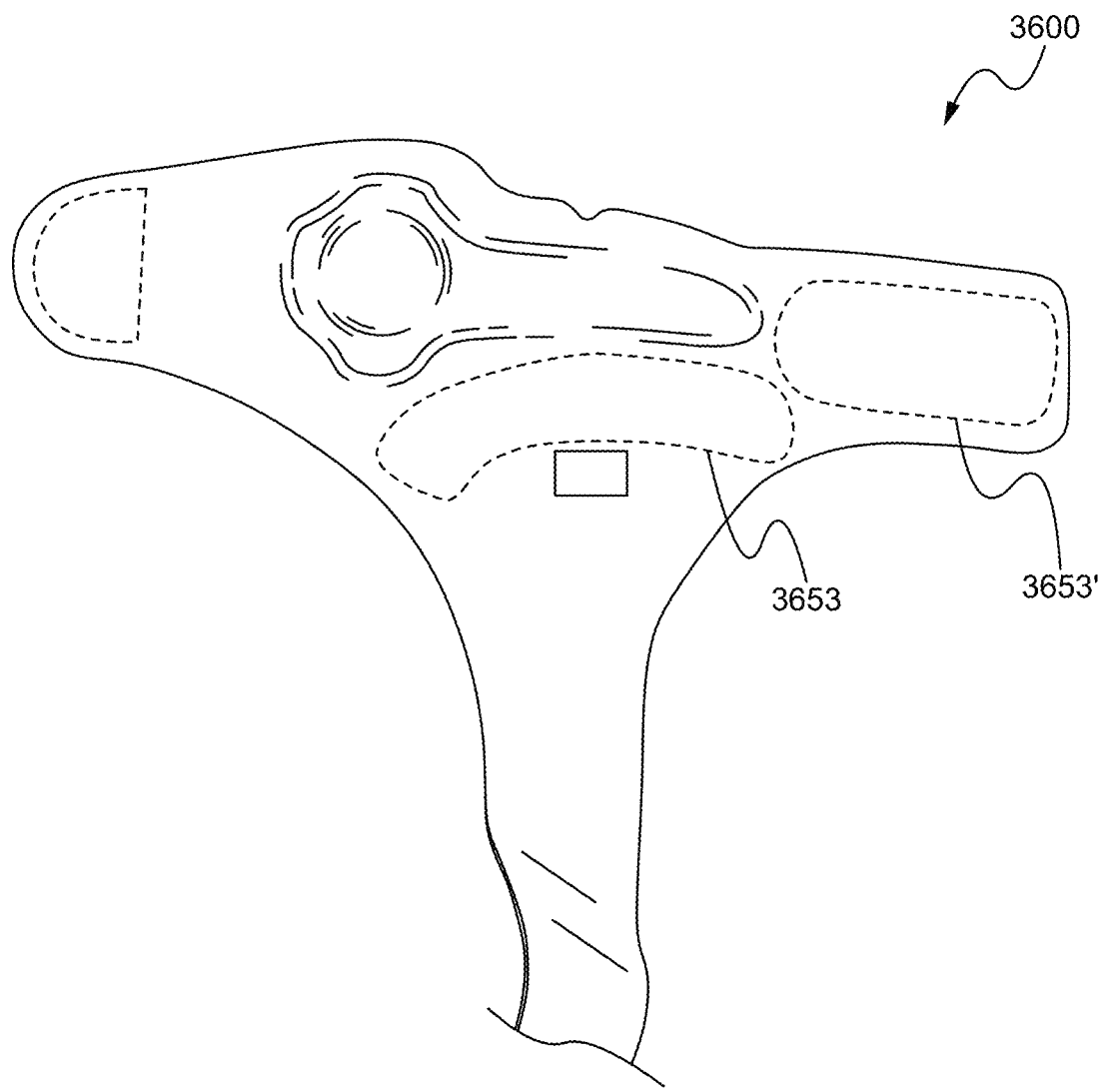
Figure 36E:
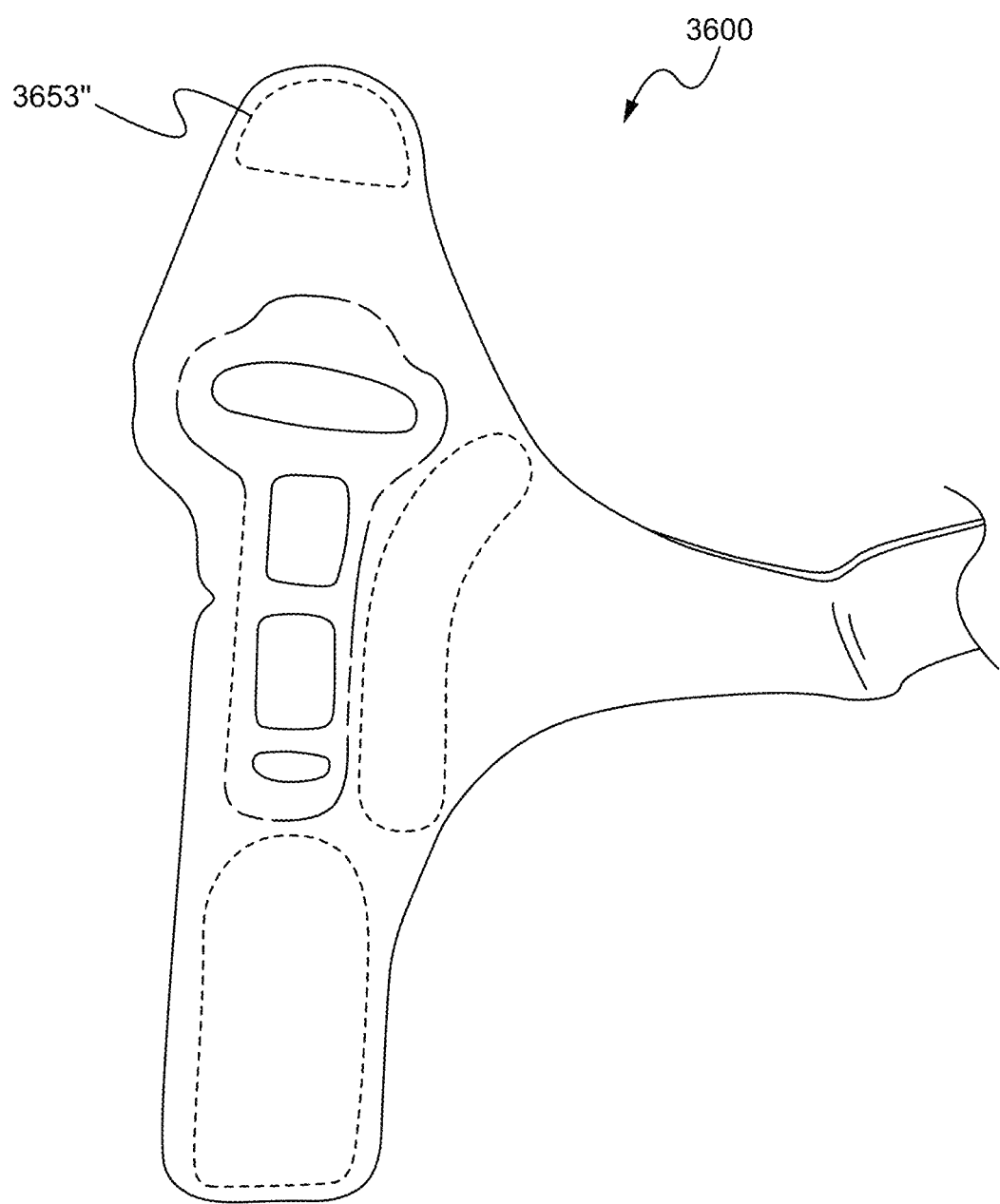

In some embodiments, such as shown within FIGS. 36D and 36E, the EMF shielding material 3653, 3653' and 3653" is sewn into the material of the sock device. In some embodiments, the EMF shielding material 3653, 3653' and 3653" comprises one or more or a mix of stainless steel fibers, polyester and cotton. However, the EMF shielding material is able to comprise any material and/or mix of materials for reflecting the EMF radiation.

As described above, in some embodiments, the EMF radiation shielding material 3651, 3651' and 3651" comprises silver, copper, or a combination thereof. In some embodiments, the EMF radiation shielding material 3651, 3651' and 3651" comprises a silver or copper laminate. However, the EMF radiation shielding material 3651, 3651' and 3651" is able to comprise any appropriately desired EMF radiation shielding material. For example, in some embodiments, the EMF radiation shielding material 3651, 3651' and 3651" comprises a plurality of embedded metal particles. In some embodiments, such as described above, the EMF radiation shielding material 3651, 3651' and 3651" comprises NEMKO lab tested and certified EMF radiation shielding material.

Figure 37:
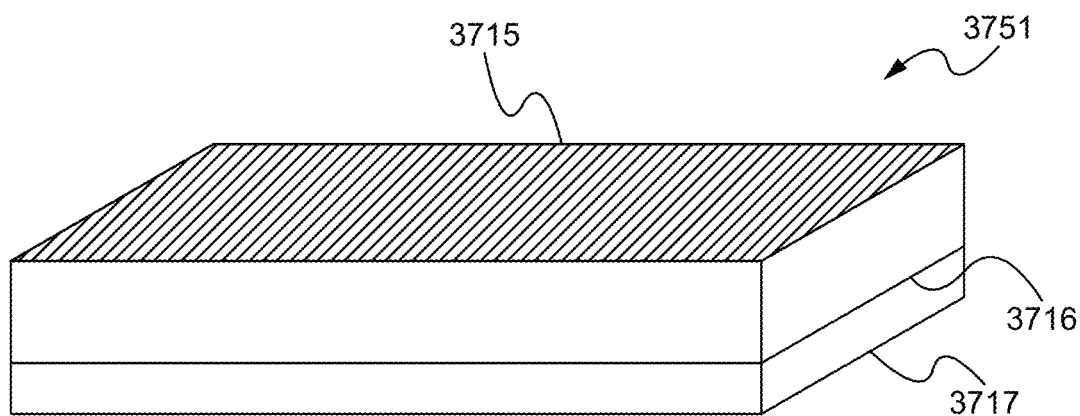
FIG. 37 illustrates an EMF shielding material for deflecting electro and electromagnetic radiation, in accordance with some embodiments.
Figure 38:
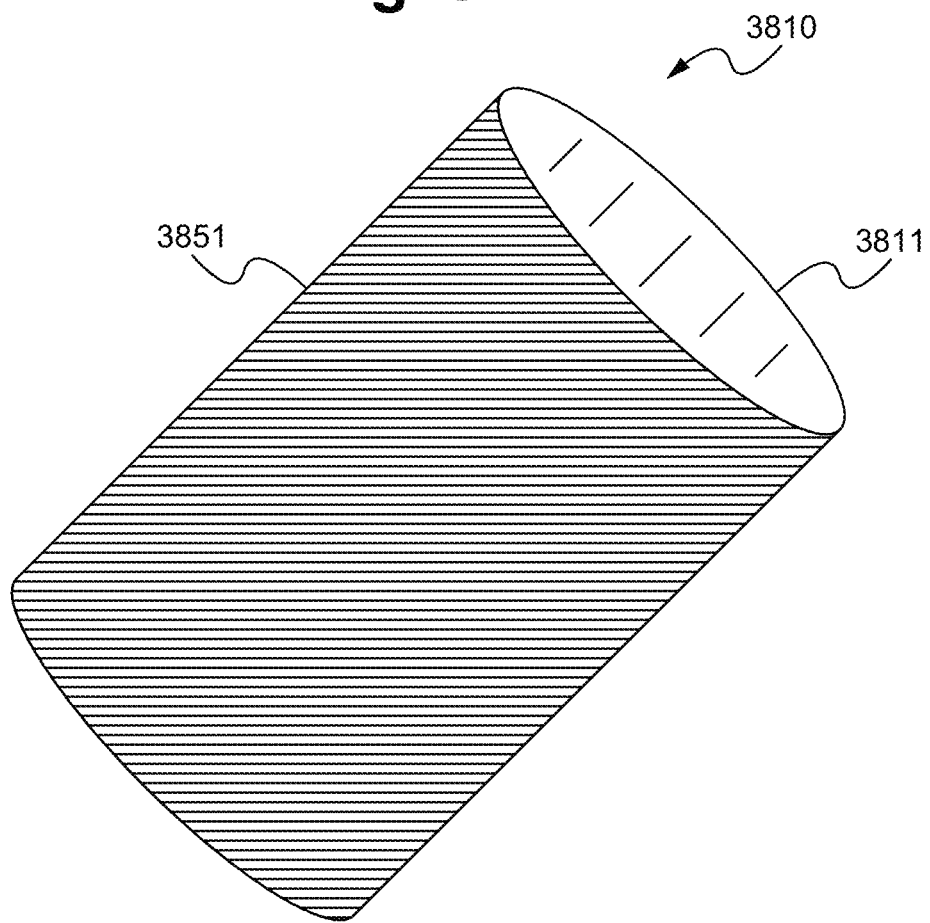
FIG. 38 illustrates a sleeve comprising an EMF shielding material for deflecting electro and electromagnetic radiation that is configured to fit around a body of an earbud, in accordance with some embodiments.

FIGS. 37 and 38 illustrate an EMF radiation shielding material, such as described above. The EMF radiation shielding material is configured to couple to an object that emits EMF radiation to deflect the EMF radiation produced by the object away from a user.

As shown within FIG. 37, the EMF shielding material 3751 comprises a first layer 3715, a second layer 3716 and a third layer 3717. In some embodiments, the first layer 3715 comprises a P.E.T. plastic and/or vinyl layer, the second layer 3716 comprises a EMF deflecting layer and the third layer 3717 comprises an adhesive layer 3717 for coupling the EMF shielding material 3751 with an object. In some embodiments, the emf shielding material further comprises a clear coat layer over the P.E.T. plastic and/or vinyl layer 3715. In some embodiments, the EMF radiation shielding material comprises an adhesive backing 3717 for coupling the EMF radiation shielding material 3751 with an object, such as described above. However, the backing 3717 is able to comprise any appropriately desired mechanism for coupling the radiation shielding material 3751 to an object. For example, the backing 3717 enables the EMF radiation shielding material 3751 to couple with an object using a magnetic or hook and loop connection. Additionally, in some embodiments, the backing 3717 comprises the EMF deflecting layer 3716. In this manner, the EMF shielding material 3751 is coupled with an object and the EMF radiation from the object is deflected by the EMF deflecting layer 3716 and away from a user of the object.

In some embodiments the object comprises a wearable object, such as a watch, a bracelet, a necklace and a sock, such as described above. However, the object is able to comprise any appropriately desired wearable object. In further embodiments, the object comprises an electronic device such as a tablet, a smart phone and a computer. Particularly, as will be apparent to someone of ordinary skill in the art, the object is able to comprise any appropriately desired object that emits EMF radiation.

In some embodiments, the EMF deflecting layer 3716 comprises silver, copper, or a combination thereof. In some embodiments, the layer 3716 comprises a silver or copper laminate. In some embodiments, the layer 3716 comprises a plurality of embedded metal particles. However, as described above, the EMF deflecting layer 3716 is able to comprise any appropriately desired EMF radiation shielding material. In some embodiments, such as described above, the layer 3716 comprises NEMKO lab tested and certified EMF radiation shielding material.

As described in relation to the Figures above, the EMF shielding material 3751 is able to couple with an interior and/or an exterior of the object. Particularly, the EMF shielding material 3751 is able to couple with any appropriately desired location of an object to deflect EMF radiation away from the object. In some embodiments, the EMF shielding material comprises a lining that is able to placed on an inside and/or an interior of an object to deflect EMF radiation produced by the object. In some embodiments, the EMF deflecting layer 3716 is embedded into polycarbonate plastic, other plastic or silicone of the object. Particularly, the EMF deflecting layer 3716 is able to be placed in any appropriately desired location to deflect EMF radiation produced by an object.

FIG. 38 illustrates a sleeve 3810 that is configured to fit around a body of an object, such as described above. The sleeve 3810 comprises a first section or side comprising EMF radiation shielding material 3851 and a second section or side 3811 that does not have the EMF radiation shielding material 3851. The sleeve 3810 is fit around an object such that the first section comprising EMF radiation shielding material 3851 is on a side next to a user of the object. Consequently, when the object is being used, the EMF radiation shielding material 3851 deflects EMF radiation away from the user.

In some embodiments, the second side 3811 comprises a transparent material which enables EMF radiation to pass through the second side 3811. In this manner, the EMF shielding material 3751 is coupled with an object and the EMF radiation from the object is deflected by the EMF shielding coating 3715 back through the second side 3811 and away from a user of the object.

In some embodiments the object comprises a wearable object, such as a watch, a bracelet, a necklace and a sock, such as described above. However, the object is able to comprise any appropriately desired wearable object. In further embodiments, the object comprises an electronic device such as a tablet, a smart phone and a computer. Particularly, as will be apparent to someone of ordinary skill in the art, the object is able to comprise any appropriately desired object that emits EMF radiation.

As described above, in some embodiments, the shielding material 3851 comprises silver, copper, or a combination thereof. In some embodiments, the shielding material 3851 comprises a silver or copper laminate. However, as described above, the shielding material 3851 is able to comprise any appropriately desired EMF radiation shielding material. For example, in some embodiments, the shielding material 3851 comprises a plurality of embedded metal particles. In some embodiments, such as described above, the EMF radiation shielding material comprises NEMKO lab tested and certified EMF radiation shielding material.

In use an electromagnetic magnetic shielding material is used deflect electronic and electromagnetic radiation away from an electronic device. In this manner, the electromagnetic shielding material deflects the electronic and electromagnetic radiation from a user to protect the user from any electronic and electromagnetic radiation produced by the electronic device. Additionally, because the electronic and electromagnetic radiation is deflected away from the user, rather than absorbed, a user is able to safely use the electronic device with less or no exposure to electronic and electromagnetic radiation. As such, the EMF shielding material for an electronic device as described herein has many advantages.

The present invention has been described in terms of specific embodiments incorporating details to facilitate the understanding of the principles of construction and operation of the invention. Such references, herein, to specific embodiments and details thereof are not intended to limit the scope of the claims appended hereto. It will be apparent to those skilled in the art that modifications can be made in the embodiments chosen for illustration without departing from the spirit and scope of the invention.

What is claimed is:

1. An electromagnetic shielding device comprising:
   a device body coupled to a wireless earbud,
   the wireless earbud having a stem disposed below an ear tip, the stem comprising an inner portion and an outer portion forming a stem circumference, wherein the wireless earbud is configured to send a wireless signal to a secondary wireless earbud through the inner portion of the stem, the device body comprising:
   a device body width,
   a first layer comprising an electromagnetic transparent material,
   a second layer having an adhesive backing material for coupling with the object, and
   a third layer disposed between the first layer and the second layer,
   the third layer comprises a material configured to deflect electromagnetic radiation,
   wherein the device body is coupled to the inner portion of the stem, the device body having a device body width less than the stem circumference.

2. The electromagnetic shielding device of claim 1, wherein the device body width is greater than or equal to one-half the earbud body circumference.

3. The electromagnetic shielding device of claim 1, wherein the first layer, the second layer, and third layer comprise a thickness which enables the wireless earbud to be placed within a charging case with the electromagnetic shielding device coupled therewith.

4. The electromagnetic shielding device of claim 1, wherein the device body comprises a cylindrical form with the second layer disposed on an interior of the cylindrical form.

5. The electromagnetic shielding device of claim 4, wherein the device body comprises a gap extending along a longitudinal axis of the cylindrical form.

6. A system for reducing electromagnetic radiation to a user wearing a first wireless earbud and a second wireless earbud comprising:
   a first electromagnetic shielding device configured to couple to the first wireless earbud at a first inner portion of a first stem of the first wireless earbud, the first inner portion being configured to receive wireless signals, the first electromagnetic shielding device comprises a material configured to deflect electromagnetic radiation, the first electromagnetic shielding device includes a first device body width and a first adhesive backing material; and
   a second electromagnetic shielding device configured to couple to the second wireless earbud at a second inner portion of a second stem of the second wireless earbud, the second inner portion being configured to receive wireless signals,
   the second electromagnetic shielding device comprises a material configured to deflect electromagnetic radiation, the second electromagnetic shielding device includes a second device body width and a second adhesive backing material;
   wherein the first stem comprises a first stem circumference and a second stem comprises a second stem circumference; and
   further wherein the first device body width is less than the first stem circumference and the second device body width is less than the second stem circumference.

7. The system of claim 6, wherein the first device body width is greater than or equal to one-half the first stem circumference, and the second device body width is greater than or equal to one-half the second stem circumference.

8. The system of claim 6, the first electromagnetic shielding device further comprising an electromagnetic transparent material.

9. The system of claim 6, the second electromagnetic shielding device further comprising an electromagnetic transparent material.

10. The system of claim 6, wherein the first electromagnetic shielding device comprises a cylindrical form with the first adhesive backing material being disposed on an interior of the cylindrical form.

11. The system of claim 10, wherein the first electromagnetic shielding device comprises a gap extending along a longitudinal axis of the cylindrical form.

12. A system for reducing electromagnetic radiation comprising:
    a first wireless earbud,
       the first wireless earbud comprising a first stem disposed below a first ear tip, the first stem comprising a first inner portion and a first outer portion forming a first stem circumference, wherein the first inner portion is configured to receive wireless signals;
    a second wireless earbud,
       the second wireless earbud comprising a second stem disposed below a second ear tip, the second stem comprising a second inner portion and a second outer portion forming a second stem circumference, wherein the second inner portion is configured to receive wireless signals;
    a first electromagnetic shielding device coupled to the first inner portion,
       the first electromagnetic shielding device comprising a material configured to deflect electromagnetic radiation, the first electromagnetic shielding device includes a first device body width and a first adhesive backing material; and
    a second electromagnetic shielding device coupled to the second inner portion;
       the second electromagnetic shielding device comprising a material configured to deflect electromagnetic radiation, the second electromagnetic shielding device includes a second device body width and a second adhesive backing material;

wherein the first device body width is less than the first stem circumference and the second device body width is less than the second stem circumference.

13. The system of claim 12, wherein the first device body width is greater than or equal to one-half the first stem circumference, and the second device body width is greater than or equal to one-half the second stem circumference.

14. The system of claim 12, the first electromagnetic shielding device further comprising an electromagnetic transparent material.

15. The system of claim 12, the second electromagnetic shielding device further comprising an electromagnetic transparent material.

16. The system of claim 12, wherein the first electromagnetic shielding device comprises a cylindrical form with the first adhesive backing material being disposed on an interior of the cylindrical form.

17. The system of claim 16, wherein the first electromagnetic shielding device comprises a gap extending along a longitudinal axis of the cylindrical form.

* * * * *